United States Patent
Ramanujam et al.

(10) Patent No.: US 11,010,503 B2
(45) Date of Patent: May 18, 2021

(54) METHOD AND SYSTEM PROVIDING TEMPORAL-SPATIAL PREDICTION OF LOAD DEMAND

(71) Applicant: Tata Consultancy Services Limited, Mumbai (IN)

(72) Inventors: Arvind Ramanujam, Taramani (IN); Pandeeswari Sankaranarayanan, Taramani (IN); Arunchandar Vasan, Taramani (IN); Rajesh Jayaprakash, Taramani (IN); Venkatesh Sarangan, Taramani (IN); Anand Sivasubramaniam, Taramani (IN)

(73) Assignee: Tata Consultancy Services Limited, Mumbai (IN)

( * ) Notice: Subject to any disclaimer, the term of this patent is extended or adjusted under 35 U.S.C. 154(b) by 453 days.

(21) Appl. No.: 15/980,390

(22) Filed: May 15, 2018

(65) Prior Publication Data

US 2019/0353690 A1   Nov. 21, 2019

(51) Int. Cl.
   *G06F 30/15*   (2020.01)
   *B60L 53/67*   (2019.01)
   (Continued)

(52) U.S. Cl.
   CPC .............. *G06F 30/15* (2020.01); *B60L 53/63* (2019.02); *B60L 53/67* (2019.02); *B60L 53/68* (2019.02);
   (Continued)

(58) Field of Classification Search
   CPC .......... G06F 30/15; G06F 30/20; B60L 53/68; B60L 53/63; B60L 53/67; B60L 2240/70;
   (Continued)

(56) References Cited

U.S. PATENT DOCUMENTS

| | | | |
|---|---|---|---|
| 7,844,370 | B2 | 11/2010 | Pollack et al. |
| 9,026,347 | B2 | 5/2015 | Gadh et al. |
| 9,067,589 | B1 | 6/2015 | Zhao et al. |
| 2009/0259355 | A1 | 10/2009 | Li |
| 2011/0001356 | A1* | 1/2011 | Pollack ............... H02J 3/381 |
| | | | 307/31 |

(Continued)

FOREIGN PATENT DOCUMENTS

| CN | 107067110 A | 8/2017 |
|---|---|---|
| CN | 107330564 A | 11/2017 |

(Continued)

OTHER PUBLICATIONS

Viswanathan, Vaisagh, et al. "Simulation-assisted exploration of charging infrastructure requirements for electric vehicles in urban environments." Journal of Computational Science 12 (2016): 1-10. (Year: 2016).*

(Continued)

*Primary Examiner* — Kamini S Shah
*Assistant Examiner* — John E Johansen
(74) *Attorney, Agent, or Firm* — Finnegan, Henderson, Farabow, Garrett & Dunner, LLP

(57) ABSTRACT

Method and system for predicting temporal-spatial distribution of load demand on an electric grid due to a plurality of Electric Vehicles (EVs) is described. The method includes creating an EV load demand (EVLD) model for a Region of Interest (ROI) serviced by the electric grid, wherein the EVLD model integrates an EV model and a transport simulator simulating EV traffic conditions for the ROI. Further, the method includes computing the load demand in time and space in terms of State of Charge (SOC) of a battery for each EV among the plurality of EVs in the ROI, based on the EVLD model. Furthermore, the method includes aggregating the computed the load demand, in terms of the SOC, of each EV in time domain and space domain to create a temporal-spatial impact of the load demand by the plurality of EVs on the electric grid for the ROI.

12 Claims, 17 Drawing Sheets

(51) Int. Cl.
*B60L 53/68* (2019.01)
*B60L 53/63* (2019.01)
*G06F 30/20* (2020.01)

(52) U.S. Cl.
CPC .......... *G06F 30/20* (2020.01); *B60L 2240/70* (2013.01); *B60L 2260/50* (2013.01); *B60L 2260/52* (2013.01); *B60L 2260/54* (2013.01); *B60L 2260/58* (2013.01); *Y02T 10/70* (2013.01); *Y02T 10/7072* (2013.01); *Y02T 10/72* (2013.01); *Y02T 90/12* (2013.01); *Y02T 90/16* (2013.01); *Y02T 90/167* (2013.01); *Y04S 10/126* (2013.01); *Y04S 30/12* (2013.01)

(58) Field of Classification Search
CPC ............. B60L 2260/50; B60L 2260/52; B60L 2260/54; B60L 2260/58; Y02T 10/7072; Y02T 10/70; Y02T 90/16; Y02T 10/72; Y02T 90/167; Y02T 90/12; Y04S 30/12; Y04S 10/126
USPC ............................................................ 703/8
See application file for complete search history.

(56) References Cited

U.S. PATENT DOCUMENTS

2016/0185246 A1* 6/2016 Paul ........................ B60L 53/67
320/106
2016/0335377 A1* 11/2016 Yamashina .......... G08G 1/0112

FOREIGN PATENT DOCUMENTS

| JP | 2006014393 A | * | 1/2006 |
| JP | 2014042383 A | * | 3/2014 |
| JP | 2014235709 A | * | 12/2014 |

OTHER PUBLICATIONS

Guo, Qinglai, et al. "Factor analysis of the aggregated electric vehicle load based on data mining." Energies 5.6 (2012). pp. 2053-2070. (Year: 2012).*

Yunfei Mu et al. A Spatial-Temporal model for grid impact analysis of plug-in electric vehicles; Applied Energy; Date: Feb. 2014, vol. 114; pp. 456-465 Publisher: Elsevier Ltd.Link: https://ac.els-cdn.com/S030626191300826X/1-s2.0-S030626191300826X.

* cited by examiner

DISCHARGE

RECHARGE

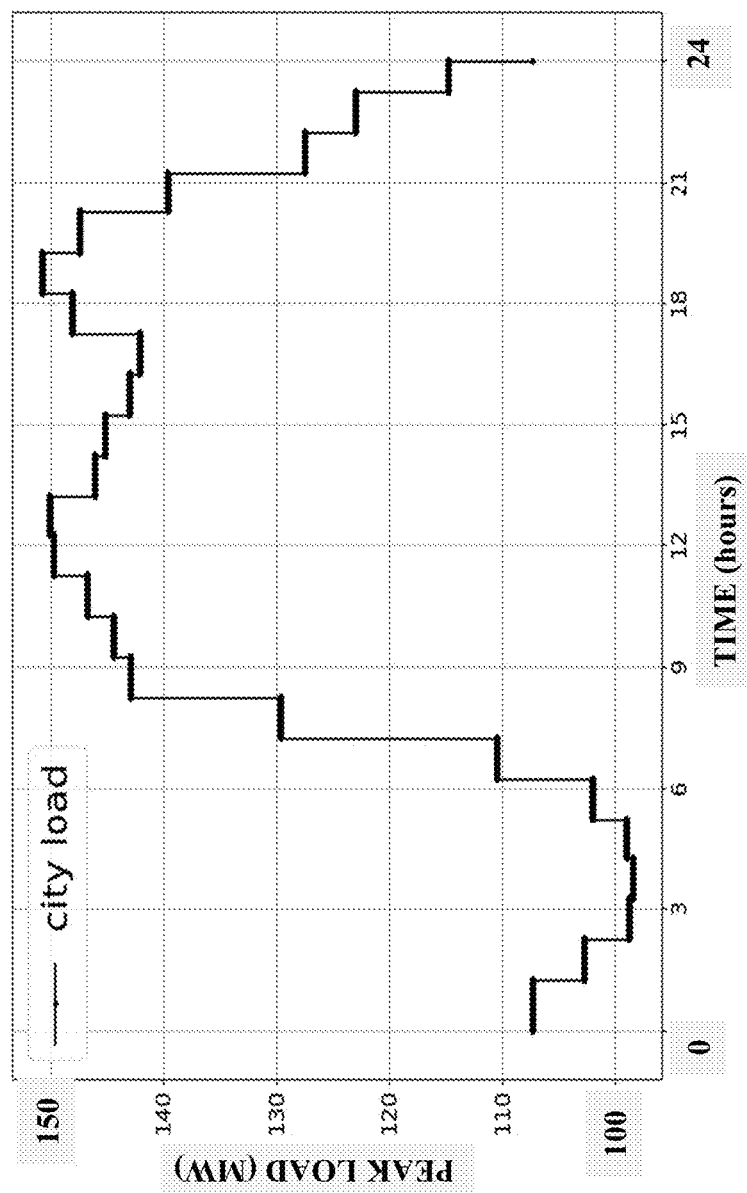
FIG. 4E (a) Base demand of Greater Luxembourg

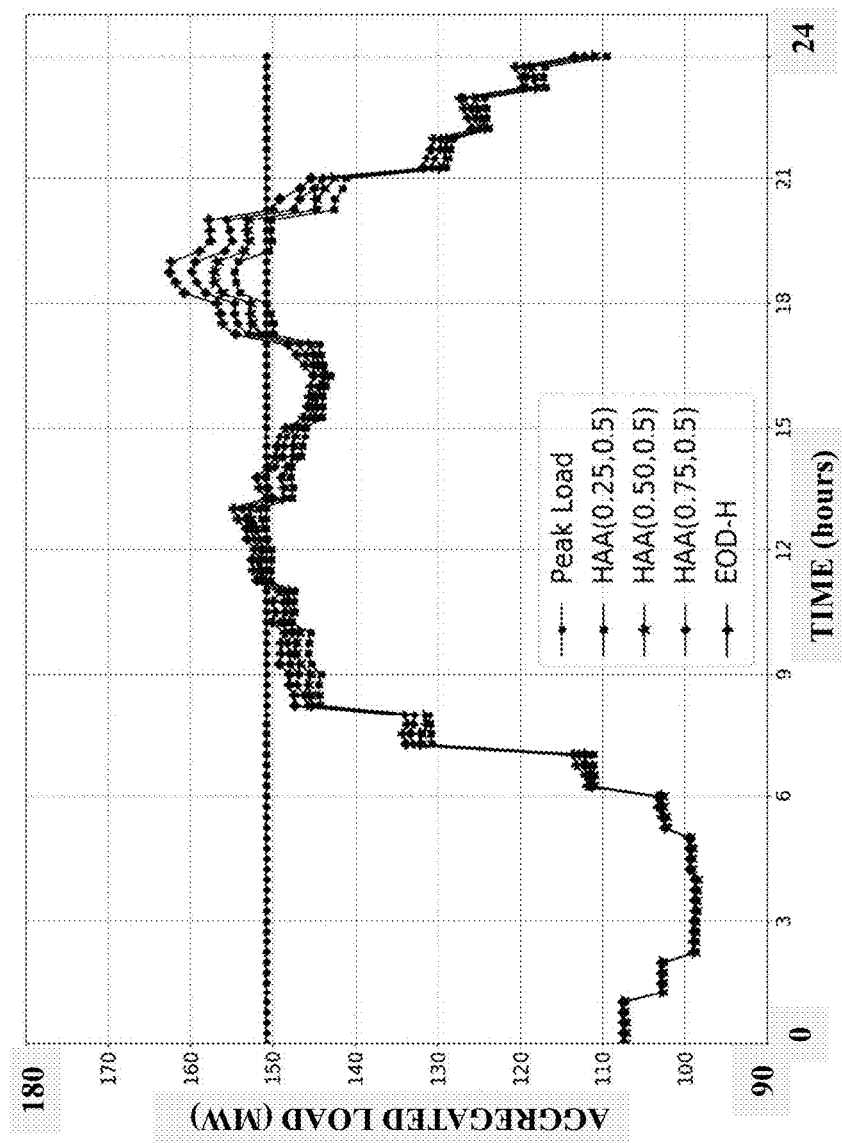
FIG. 4E (b) Impact at 15% penetration

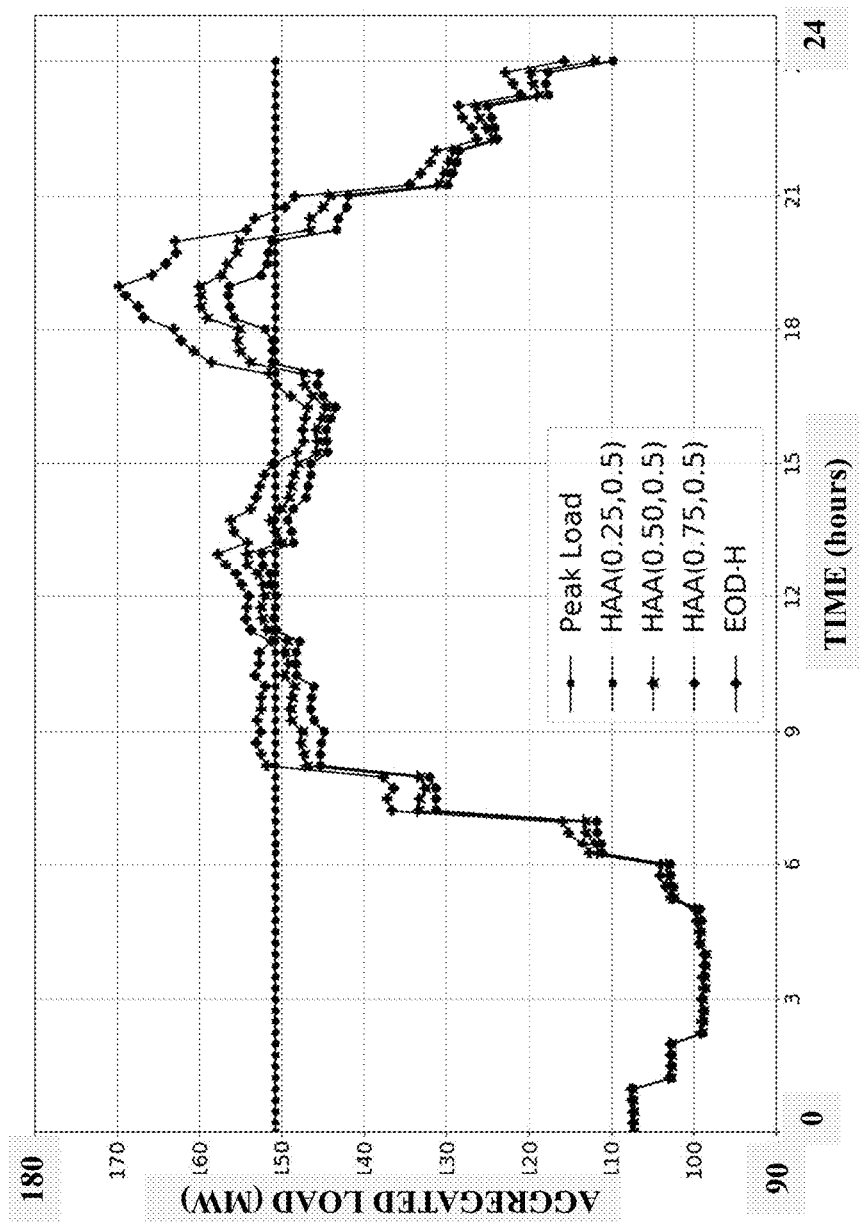
FIG. 4E (c) Impact at 25% penetration

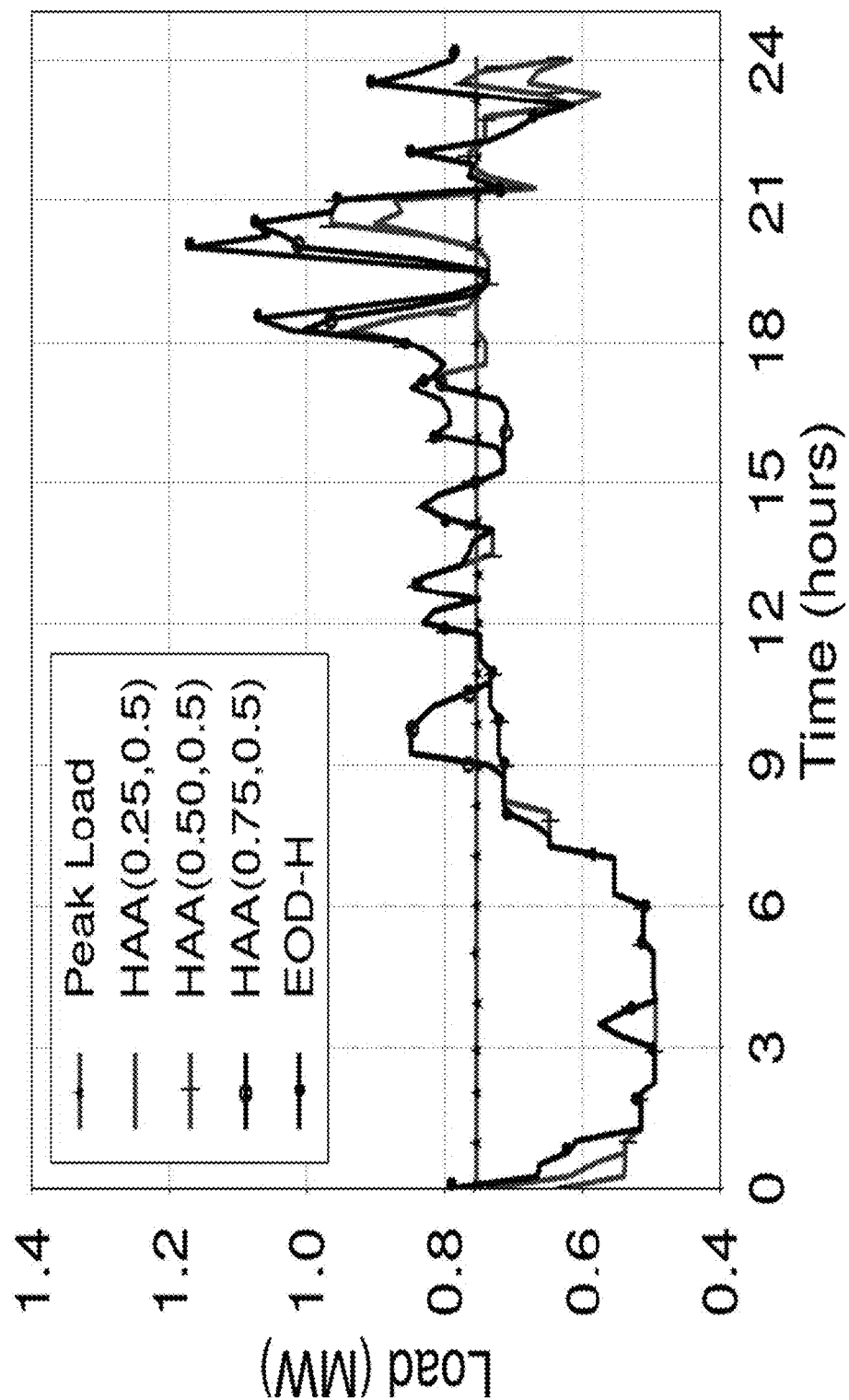
FIG. 4G (a) Total demand at 15% EV penetration

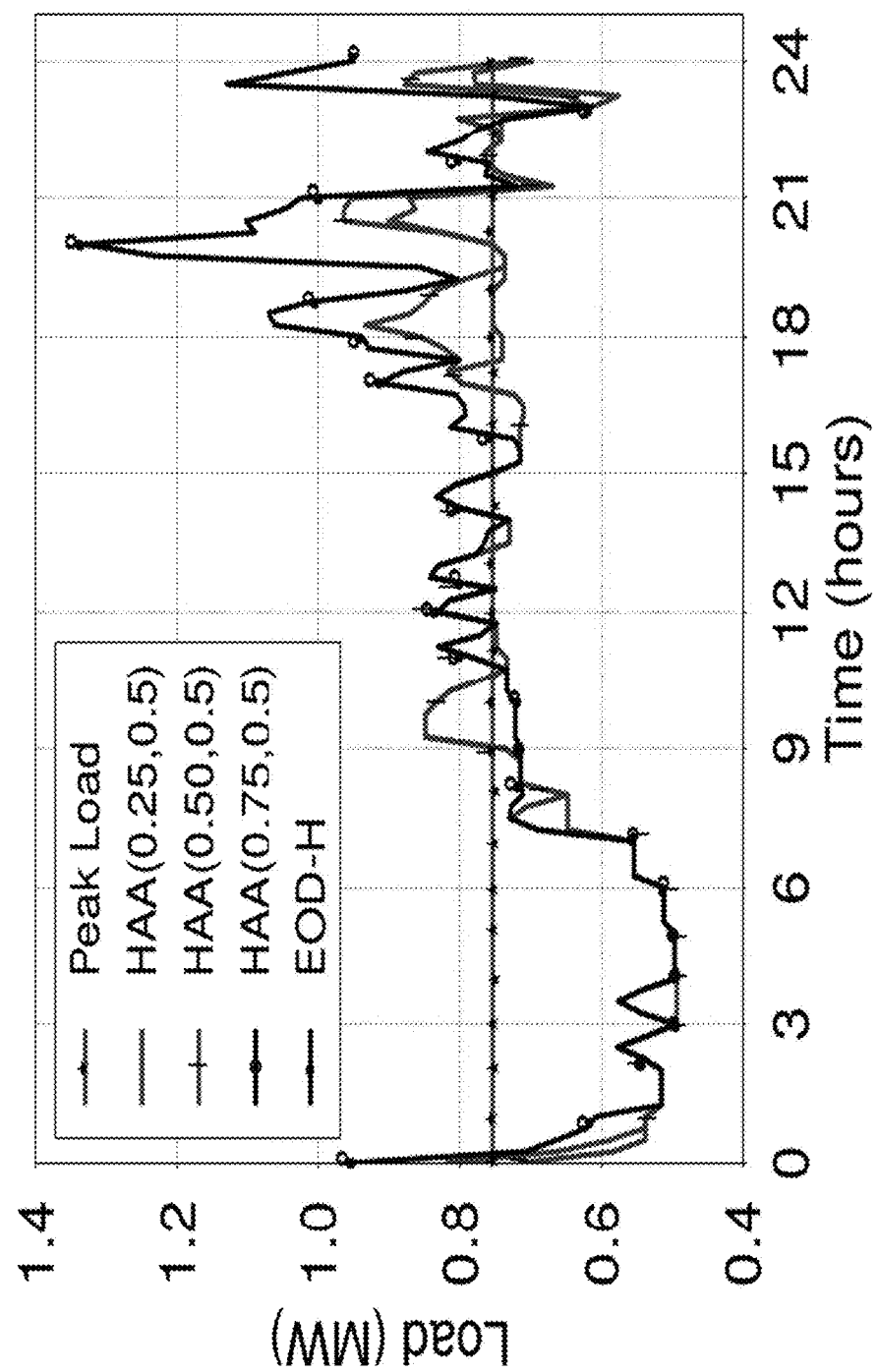
FIG. 4G (b) Total demand at 25% EV penetration

METHOD AND SYSTEM PROVIDING TEMPORAL-SPATIAL PREDICTION OF LOAD DEMAND

TECHNICAL FIELD

The disclosure herein generally relates to Electrical Vehicles (EVS) and, more particularly to load demand of EVs on an electric grid.

BACKGROUND

As the adoption of Electric Vehicles (EVs) increases, it is important to reliably characterize their recharging load on an electrical grid.
Understanding the load demand of EV at an aggregate level, while necessary to uncover any supply-side problems, is not sufficient. The reason, last-mile of the electrical grid is hardly envisioned by load analysis for EV usage. Further, it is critical to identify any demand-side (EV load demand) hotspots using the spatial distribution of the aggregate EV demand. The spatial distribution depends on both the consumption patterns and recharging policies of EV users. The consumption pattern of EVs depends on the traffic patterns in the city; and the recharging policies, on the preferences of users and the charging locations of their vehicles. Thus to understand the spatial distribution of the EV load on the electric grid, it is important need to understand the traffic load on the transport grid or the electric grid servicing the EVs Most exiting methods deal with supply side (electric grid side) analysis providing management for the charging of EVs. An existing method provides insight on load side demand and predicts characteristics of the EVs such as arrivals, charge levels, locations for the EVs that get plugged into the electric grid. However, the prediction is based on statistical methods, thus such a prediction has limited accuracy as it does not leverage inputs from data associated with traffic demand, EV models, road network, demographic distribution. Yet another existing method refers to spatial—temporal model to evaluate the impact of large scale deployment of plug-in EVs on urban distribution networks. However, the EV model considered is not a fine grained EV model, hence is unable to consider the regenerative breaking, which is major factor in recharging of the batteries of the EVs in urban traffic in practical scenarios. Thus battery status of the EVs tracked based on the existing method provides lower accuracy.

SUMMARY

Embodiments of the present disclosure present technological improvements as solutions to one or more of the above-mentioned technical problems recognized by the inventors in conventional systems. For example, in one embodiment, a method for predicting temporal-spatial distribution of load demand on an electric grid due to a plurality of Electric Vehicles (EVs) is described. The method comprising creating an EV load demand (EVLD) model for a Region of Interest (ROI) serviced by the electric grid, wherein the EVLD model integrates an EV model and a transport simulator simulating EV traffic conditions for the ROI. Further, the method comprises computing the load demand in time and space in terms of State of Charge (SOC) of a battery for each EV among the plurality of EVs in the ROI, based on the EVLD model. The transport simulator tracks location of each EV of the ROI in space domain and time domain in terms velocity and acceleration of the corresponding EV at regular time windows at every location among a plurality of location traversed by the EV based on the traffic conditions of the ROI simulated by the transport simulator. The EV model provides load demand of each EV in time domain in terms of the SOC of the battery for a corresponding EV for a corresponding time window among the regular time windows, wherein the SOC is estimated based on the velocity and the acceleration of the corresponding EV for the corresponding time window. Furthermore, the method comprises aggregating the computed the load demand, in terms of the SOC, of each EV in time domain and space domain to create a temporal-spatial impact of the load demand by the plurality of EVs on the electric grid for the ROI.

In another aspect, a system for creating an EV load demand (EVLD) model for a Region of Interest (ROI) serviced by the electric grid is disclosed. The system comprises a memory operatively coupled to one or more hardware processors and configured to store instructions configured for execution by the one or more hardware processors to create an EV load demand (EVLD) model for a Region of Interest (ROI) serviced by the electric grid, wherein the EVLD model integrates an EV model and a transport simulator simulating EV traffic conditions for the ROI; and compute the load demand in time and space in terms of State of Charge (SOC) of a battery for each EV among the plurality of EVs in the ROI, based on the EVLD model (304). The transport simulator tracks location of each EV of the ROI in space domain and time domain in terms velocity and acceleration of the corresponding EV at regular time windows at every location among a plurality of location traversed by the EV based on the traffic conditions of the ROI simulated by the transport simulator. The EV model provides load demand of each EV in time domain in terms of the SOC of the battery for a corresponding EV for a corresponding time window among the regular time windows, wherein the SOC is estimated based on the velocity and the acceleration of the corresponding EV for the corresponding time window. Further, the system is configured to aggregate the computed the load demand, in terms of the SOC, of each EV in time domain and space domain to create a temporal-spatial impact of the load demand by the plurality of EVs on the electric grid for the ROI.

In yet another aspect, a non-transitory computer readable medium is provided. The non-transitory computer-readable medium stores instructions which, when executed by a hardware processor, cause the hardware processor to perform acts comprising creating an EV load demand (EVLD) model for a Region of Interest (ROI) serviced by the electric grid, wherein the EVLD model integrates an EV model and a transport simulator simulating EV traffic conditions for the ROI (302). Further, the act comprise computing the load demand in time and space in terms of State of Charge (SOC) of a battery for each EV among the plurality of EVs in the ROI, based on the EVLD model, wherein the transport simulator tracks location of each EV of the ROI in space domain and time domain in terms velocity and acceleration of the corresponding EV at regular time windows at every location among a plurality of location traversed by the EV based on the traffic conditions of the ROI simulated by the transport simulator; and the EV model provides load demand of each EV in time domain in terms of the SOC of the battery for a corresponding EV for a corresponding time window among the regular time windows, wherein the SOC is estimated based on the velocity and the acceleration of the corresponding EV for the corresponding time window. Further, the acts comprise aggregating the computed the load demand, in terms of the SOC, of each EV in time domain and space domain to create a temporal-spatial impact of the load demand by the plurality of EVs on the electric grid for the ROI.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles:

FIG. 4A to 4I are graphical illustrations supporting the description corresponding to steps of predicting the temporal-spatial load demand using the EVLD model, in accordance with some embodiments of the present disclosure.

Figure 1:
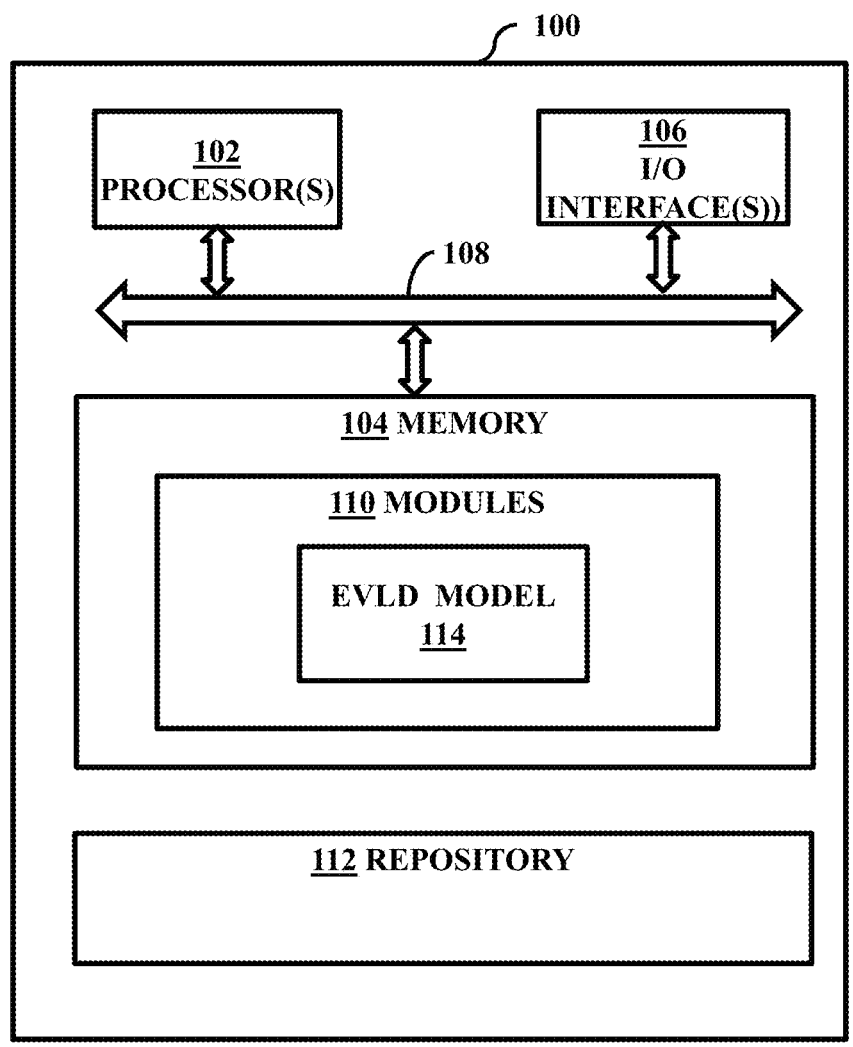
FIG. 1 illustrates a functional block diagram of a system providing temporal-spatial prediction of load demand using an Electrical Vehicle Load Demand (EVLD) model, according to some embodiments of the present disclosure.

It should be appreciated by those skilled in the art that any block diagrams herein represent conceptual views of illustrative systems and devices embodying the principles of the present subject matter. Similarly, it will be appreciated that any flow charts, flow diagrams, and the like represent various processes which may be substantially represented in computer readable medium and so executed by a computer or processor, whether or not such computer or processor is explicitly shown.

DETAILED DESCRIPTION OF EMBODIMENTS

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Understanding impact of Electrical Vehicles (EVs) is provided by existing approaches in literature, but mostly worked upon in each of the following isolated areas. One area deals EV model generation providing individual vehicle modeling as a part of car or vehicle design initiative. Another area deals with battery modeling wherein different types of battery chemistry, battery management systems are studied. Another area deals with traffic microsimulation to understand traffic dynamics of a region, congestion, vehicle-vehicle interaction, impact of road network changes and the like. Further, independent work is carried out for charging stations and terminals for EVs which assume various arrival and battery state models to estimate charging load of the EVs.

However, each of these areas hardly provide complete integrated picture of impact of the EV on the electric grid, which services the plurality of EVs in a Region of Interest (ROI).

Few existing approaches have integrated one or more of the above areas to estimate the impact. Their integration attempts seem to fit into the below buckets:
1. EV/Battery model—simplistic and/or linear without considering detailed driving model
2. Simple flow based model without considering vehicle interactions and braking, which does not provide a fine grained EV model.
3. Optimization of charging via smart network without understanding the underlying demographic/spatial/temporal distribution of EVs Computation of the load demand with higher accuracy the disclosed method and system provides a method and system for predicting temporal-spatial distribution of load demand on an electric grid due to a plurality of Electric Vehicles (EVs) serviced by the electric grid in a Region of Interest (ROI). The method includes creating an EV load demand (EVLD) model for the ROI, wherein the EVLD model integrates an EV model and a transport simulator simulating EV traffic conditions for the ROI. The EV model is affine grained EV model that can compute State of Charge (SOC) of a battery of the EV taking into consideration the regenerative braking, which is important factor to be considered for SOCs of EVs. Further, the method includes computing the load demand in time and space in terms of SOC, for each EV among the plurality of EVs in the ROI, based on the EVLD model. Upon computation of the load demand in terms of SOC, the method includes aggregating the load demand, in terms of the SOC, of each EV in time domain and space domain to create a temporal-spatial impact of the load demand by the plurality of EVs on the electric grid.

The method disclosed provides a very accurate EV model for SOC, which captures, on a per-time window (for example, at micro level of per second basis) the discharging and charging characteristics of the EV. Further, the method disclosed provides near-real-world driving behavior at a large scale by integrating the traffic simulator at micro scale in which individual EVs are tracked and their driving profiles captured. Further, the method disclosed provides placement and tracking of power demand for the batteries whose states are accurately captured by the fine-grained EV model and the traffic simulator (traffic model)

Referring now to the drawings, and more particularly to FIG. 1 through FIG. 4, where similar reference characters denote corresponding features consistently throughout the figures, there are shown preferred embodiments and these embodiments are described in the context of the following exemplary system and/or method.

FIG. 1 illustrates a functional block diagram of a system 100 providing temporal-spatial prediction of load demand based on the EVLD model, according to some embodiments of the present disclosure.

The system 100 includes or is otherwise in communication with one or more hardware processors such as a processor 102, at least one memory such as a memory 104, and an I/O interface 106. The processor 102 (hardware processor), the memory 104, and the I/O interface 106 may be coupled by a system bus such as a system bus 108 or a similar mechanism.

The memory 104 further may include modules 110. In an embodiment, the modules 110 includes an EVLD model 114, explained in conjunction with FIG. 2. In an embodiment, the module 110 can be an Integrated Circuit (IC), external to the memory 104, implemented using a Field-Programmable Gate Array (FPGA) or an Application-Specific Integrated Circuit (ASIC). The names of the modules of functional block in the memory module 110 referred herein, are examples used for explanation and are not a limitation. Further, the memory 104 includes a repository 112 for storing data such as processed data and intermediate data generated by the processor 102 while implementing functionalities by executing instructions in the modules 110.

The hardware processor 102 may be implemented as one or more multicore processors, a microprocessors, microcomputers, microcontrollers, digital signal processors, central processing units, state machines, logic circuitries, and/or any devices that manipulate data based on operational instructions. Among other capabilities, the hardware processor 102 is configured to fetch and execute computer-readable instructions stored in the memory 104 and communicate with the modules 110, external or internal to the memory 104, for triggering execution of functions to be implemented by the modules 110.

The I/O interface 106 in the system 100 may include a variety of software and hardware interfaces, for example, a web interface, a graphical user interface to display the temporal-spatial impact of load demand of the plurality of EVs on the electric grid. The interfaces 106 may include a variety of software and hardware interfaces, for example, interfaces for peripheral device(s), such as a keyboard, a mouse, an external memory, and a printer and a display. Further, the interfaces 106 may enable the system 100 to communicate with other devices, such as the computing device 104, web servers and external databases for collection required data. The interfaces 106 can facilitate multiple communications within a wide variety of networks and protocol types, including wired networks, for example, local area network (LAN), cable, etc., and wireless networks, such as Wireless LAN (WLAN), cellular, or satellite. For the purpose, the interfaces 106 may include one or more ports for connecting a number of computing systems with one another or to another server computer. The I/O interface 106 may include one or more ports for connecting a number of devices to one another or to another server.

The memory 104 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. Further, the modules 110 may include routines, programs, objects, components, data structures, and so on, which perform particular tasks or implement particular abstract data types. The modules 110 may include computer-readable instructions that supplement applications or functions performed by the system 100.

The repository 112 may also store data that is processed, received, or generated as a result of the execution of one or more modules in the module(s) 110. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Figure 2:
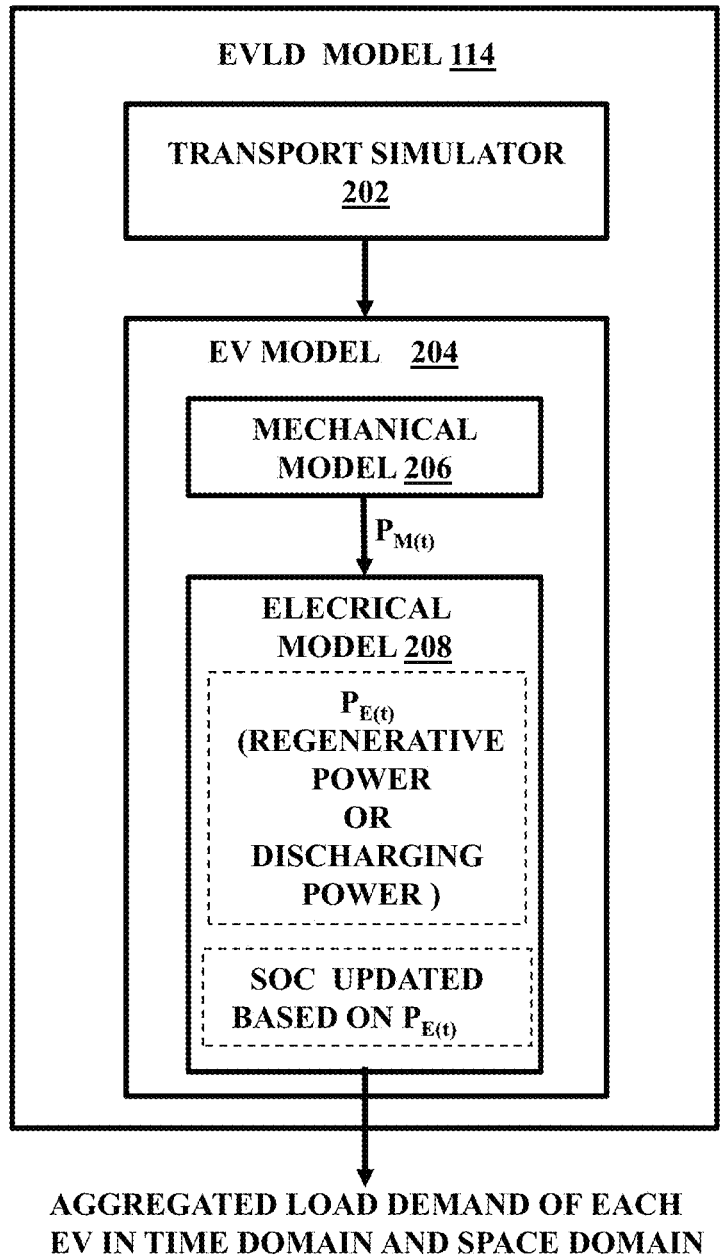
FIG. 2 illustrates the detailed functional diagram of the EVLD model of the system of FIG. 1, in accordance with some embodiments of the present disclosure.

FIG. 2 illustrates the detailed functional diagram of the EVLD model 114 of the system 100 of FIG. 1, in accordance with some embodiments of the present disclosure.

In an embodiment, shown is EVLD model 114 is provided by integrating a transport simulator 202, providing micro simulation of traffic for the ROI integrated with an EV model 204 providing EV models for each EVs in the ROI considered by the transport simulator 202.

The EVLD model 114 is configured to compute the load demand in time and space in terms the SOC of the battery for each EV among the plurality of EVs in the ROI utilizing the transport simulator 202 integrated with the EV model 204. The transport simulator 202 is configured to tracks location of each EV of the ROI in space domain and time domain in terms velocity and acceleration of the corresponding EV at regular time windows at every location among a plurality of location traversed by the EV. The tracking is based on the traffic conditions of the ROI simulated by the transport simulator 202. Further, the EV model 204 is configured to provide load demand of each EV in time domain in terms of the SOC of the battery for a corresponding EV for a corresponding time window among the regular time windows. The SOC is estimated based on the velocity and the acceleration of the corresponding EV for the corresponding time window. The EV model 204 comprises a mechanical model 206 coupled to an electrical model 208 providing load demand of each EV in terms of SOC of the battery of each EV. The EV model 204 is configured to compute the SOC of the battery for each EV by estimating, using the mechanical model 206, a mechanical power ($P_{M(t)}$) of each EV for each time window based on the velocity and the acceleration of the corresponding EV for the corresponding time window. Further, the electrical model 208 is configured to estimate an equivalent electrical power ($P_{E(t)}$) of the mechanical power ($P_{M(t)}$) for each EV for the corresponding time window. The estimated electric power ($P_{E(t)}$) corresponds to a discharging power draining the battery if the computed mechanical power is greater than zero, while the computed electric power ($P_{E(t)}$) corresponds to a regenerative power charging the battery if the computed mechanical power ($P_{M(t)}$) is less than zero. Further, the electrical model 208 is configured to update the SOC of the battery of the corresponding EV for the corresponding time window based on whether the computed equivalent electrical power ($P_E(t)$) is the regenerative power or the discharging power.

Upon computation of the SOC (updated or current SOC) of each EV in time and space, the EVLD model 114 is configured to aggregate the computed the load demand, in terms of the SOC, of each EV in time domain and space domain to create the temporal-spatial impact of the load demand by the plurality of EVs on the electric grid for the ROI. Aggregating the load demand is based on a plurality of predefined charging policies comprising the End of Day, Home (EOD-H) charging policy and the Home and Away (HAA (q, ε)) charging policy. The HAA (q, ε) charging policy further comprises a plurality of levels differentiated based on the plurality of levels of q providing unique EV penetration levels and the plurality of levels of ε providing unique SOC thresholds indicating the minimum SOC an EV user(owner) is comfortable with. The aggregation explained in detail in conjunction with an example below.

The system 100 is explained with an example embodiment explain herein. In the example embodiment, the EV model 204 is developed for a Tesla Model S (85 kWh-RWD) EV using data available in public databases and further analyzing and extracting information from distance ranges of the Tesla model S. The generated EV model 204 can estimate the SOC of the Tesla Model S's battery pack after subjecting a corresponding vehicle through an arbitrary drive cycle. The model parameters are calibrated and validated using publicly available ground-truth data. Further, the EV model 204 is integrated with the transport simulator 202, for example herein, model with SUMO (Simulation of Urban MObility). The SUMO is an open-source microscopic, space-continuous, time-discrete traffic simulation suite that can model multi- and inter-modal traffic systems, public transport and pedestrians. It comprises of tools and modules for route-finding, visualization, network import, and demand modeling. It is capable of simulating the behavior of the typical population of vehicles in a city-scale or metropolitan road network. The system 100 disclosed utilizes models that have been developed for the city of Luxembourg (ROI) and study the impact of EV penetration on Luxembourg's (ROI's) electric grid. Since, the traffic model is been calibrated and validated, the vehicular patterns realized in the simulation study are reasonably realistic. Using this integrated EVLD model 114 simulator, both the aggregate demand on the electric grid and the disaggregated demand at various neighborhoods due to EV charging can be obtained to provide temporal-spatial distribution of load demand due to EVs in the ROI. The system 100, with the EVLD model 114 can provide charging demands for varying degrees of EV adoption and different recharging policies of EV users. Further, key inputs obtained from the disclosed system 100 with the EVLD model 114 indicate ranges obtained using the EV model 204 are close to those from published data. For constant speeds the average error in the model's predicted range is about 1.83%. For varying speeds, the relative error between our model and published data is −6.7% for the EPA 2-cycle test and 2.6% for the EPA 5-cycle test. These tests are benchmark drive cycles specified by the US EPA for reporting mileage for vehicles. Further, is it indicated that an average metrics such as distance (or average velocity) are not good indicators of depth of discharge. Specifically, for the same distance travelled, the discharged battery could vary as much as 20%. The aggregate charging load even at EV penetration levels of 25% does not significantly increase the city's aggregate peak demand (<13%). However, when the overall charging load is spatially disaggregated, the neighborhood peak demands increase by more than 77% for certain neighborhoods. Further, it is identified that among the charging policies considered by the system 202 disclosed here, the daily end-of day charging at home policy which is what most EV users follow, increases the base demand's peak the maximum. Also, skew is observed in terms of the impact created by neighborhoods on the grid—10% of the neighborhoods contribute to nearly 81:5% of the impact at 25% EV penetration. This spatial skew increases as EV penetration decreases.

For generating the EV model 204 comprising the mechanical model 206 and the electrical model 208 for the example herein, simplifying assumptions are made that include 1) the road is not inclined 2) there is no head- or tailwind and 3) air-conditioning system is turned off. These assumptions can be readily relaxed if required, and assumption 3 is relaxed at some instants. Further, the EV model 204 handles cases of non-negative acceleration and deceleration separately. The notation used is summarized in Table 1 below:

TABLE 1

| Symbol | Meaning | Unit/Value |
|---|---|---|
| m | Curb weight of car + 300 lbs occupancy | 2244 kg |
| v | velocity of car | m = s |
| a | acceleration of car | m = s² |
|  | Coeff. of rolling friction (for Michelin Primacy tyres) | 0.001 (dimensionless) |
| g | Acc. due to gravity | 9.8 m = s² |
| A | Area of front cross-section | 2.34 m² |
|  | Coefficient of aerodynamic drag | 0.24 (dimensionless) |
|  | Density of air at 25 C. | 1.204 kg = m³) |
| $F_O$ | Opposing force | Newtons |
| $P_M$ | Mechanical power delivered by motor | Watts |
| $_D$(v; a) | Efficiency of conversion from electrical to mechanical power from discharge of battery | Dimensionless |
| R | Efficiency of conversion from mechanical to electrical power during regeneration of battery. | Dimensionless |

The EVLD model 114, that integrates the transport simulator 202 and the EV model 204 performs actions such as (i) at time t, the transport simulator 202 provides the EV's velocity v(t) and acceleration a(t) over [t; t+δ] (time window) depending on the traffic conditions. (ii) The EV model will decide if the v(t) and a(t) are feasible given the battery characteristics and current SOC∈(t). If realizable, the EV model 204 computes the new SOC (t+δ) depending on the energy spent over [t, t+δ]. Henceforth, the Tesla Model-S is alternatively referred as the EV and its battery pack as is alternatively referred as BEV (Battery of the EV).

The EVLD model 114 in the example herein, utilizes a car physical model (mechanical model 206) to compute the mechanical power required $P_{M(t)}$ from the velocity v(t) and acceleration a(t) of the vehicle. Further, the electrical power $P_{E(t)}$ from the mechanical power is computed using the electrical model (208). The electrical power is then used to update the SOC of the battery.

The Car Physical Model for the EV Model 204 Providing the Mechanical Model 206 and the Electrical Model 208:

a) Non-negative acceleration: To accelerate or maintain the present velocity, an electric motor in the car or EV needs to overcome the frictional force due to tire traction and aerodynamic drag. The net opposing force can be approximated as:

$$F_O = (\mu(v)mg + \tfrac{1}{2}\lambda p \cdot A \cdot v^2) \quad (1a)$$

To move the car at acceleration a, requires is a motor-supplied force of $F_0$+ma and the mechanical power required from the motor is:

$$P_M = (\mu mg + \tfrac{1}{2}\lambda \cdot A \cdot v^2 + ma) \quad (1b)$$

To translate the mechanical power required of the motor to the electrical power ($P_E$) required from the battery, intermediary blocks are abstracted by an efficiency function η(v, a) that is a function of the speed and the acceleration (such as motor's RPM and torque). Thus, $P_{E(t)} = P_{M(t)}/\eta(v, a)$ b) Deceleration: When a driver of the car presses the brakes in the EV, the battery power to the motor is cut and the inertia of the vehicle is used to (re)generate electricity while simultaneously slowing the vehicle (akin to engine braking in internal combustion vehicles). Because using the engine alone is insufficient to brake quickly at high speeds, frictional (i.e. regular brake pad) brakes are also used. The controller apportions the braking torque between the engine braking and frictional braking on the fly. Further, an arbitrary high current cannot be handled by the regenerative braking at high speed, and so such kinetic energy has to be either lost in restive circuits or frictional braking. In the system 100, disclosed herein the EV model regeneration in a simplified way as follows after accounting for the above observations. For deceleration, a<0, and therefore over [t, t+δ], depending on initial momentum of the car m·v(t), the battery may either discharge (to maintain the momentum if |a| is small and v(t) is high or recharge (if |a| is high and v(t) is low). Specifically, the mechanical power supplied by the motor $P_{M(t)}$ is calculated using the same formula as in Equation 1 b. If $P_{M(t)}$<0, then the instantaneous regenerated electrical power is determined as $\eta R|P_M(t)|$ If $P_{M(t)}$>0 despite a<0, the instantaneous discharged electrical power is determined as before as $P_{M(t)}=\eta \eta_D(v, a)$ The regeneration is avoided when $|P_M(t)|$ is approximately equal to 0 by having a minimum regeneration current. The equation 1b is a continuous equation for the power consumed or regenerated at a given point in time t. For a=0, the power consumed over [t, t+δ] is constant over the interval (time window) and can be used as it is. However, when |a|>>0, v can change significantly even within [t; t+δ]. Therefore, we need to integrate equation 1 over [t, t+δ]. To update the battery during high |a| intervals, equation 1 b is integrated and average mechanical power $\hat{P}_M(t)$ is as defined below in equation 1c, 1d and 1e:

$$\hat{P}_M(t) = \frac{1}{\delta} * \left( \int_{t'=t}^{t'=t+\delta} P_M(t')dt' \right) \quad (1c)$$

If $\hat{P}_M(t)$ is >0, the discharging power from the battery is obtained as:

$$\hat{P}_E(t) = \frac{1}{\delta} * \left( \int_{t'=t}^{t'=t+\delta} P_M(t')dt' / \eta D(t') \right) \quad (1d)$$

If $\hat{P}_M(t)$ is <0, the regenerating power from the battery is obtained as:

$$\hat{P}_E(t) = \frac{1}{\delta} * \left( \int_{t'=t}^{t'=t+\delta} P_M(t')dt' \eta R(t')dt' \right) \quad (1e)$$

Depending on the regions of operation of the car, numerical methods to suitably discretize these integral equations are used.

Figure 4A:
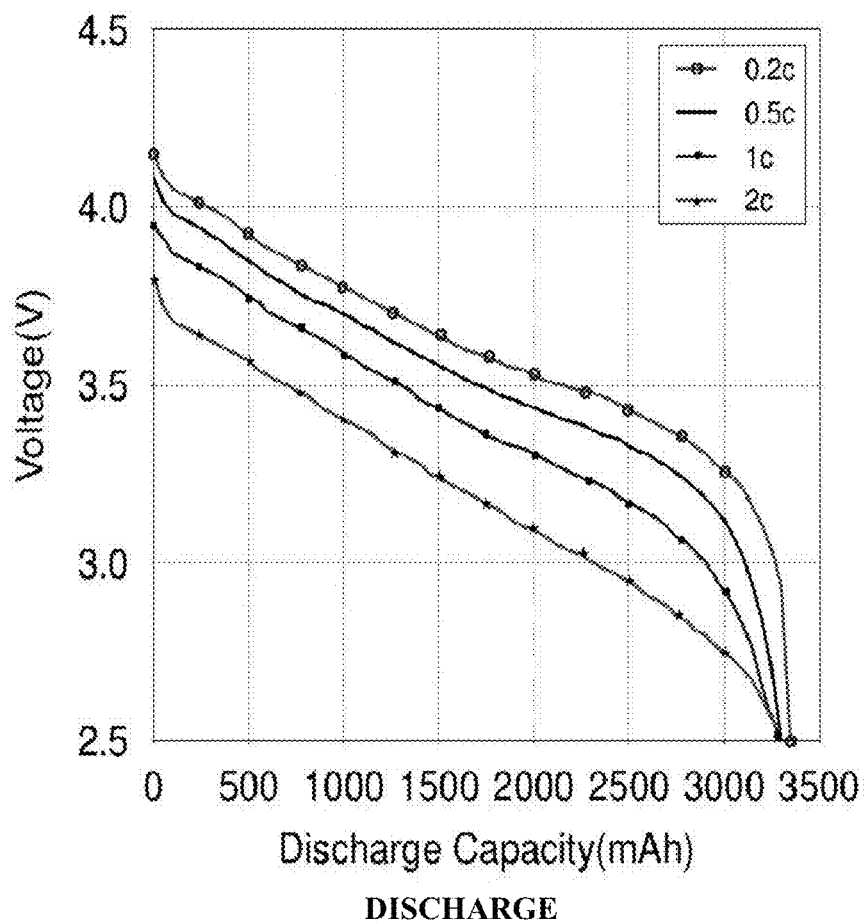
Figure 4A:
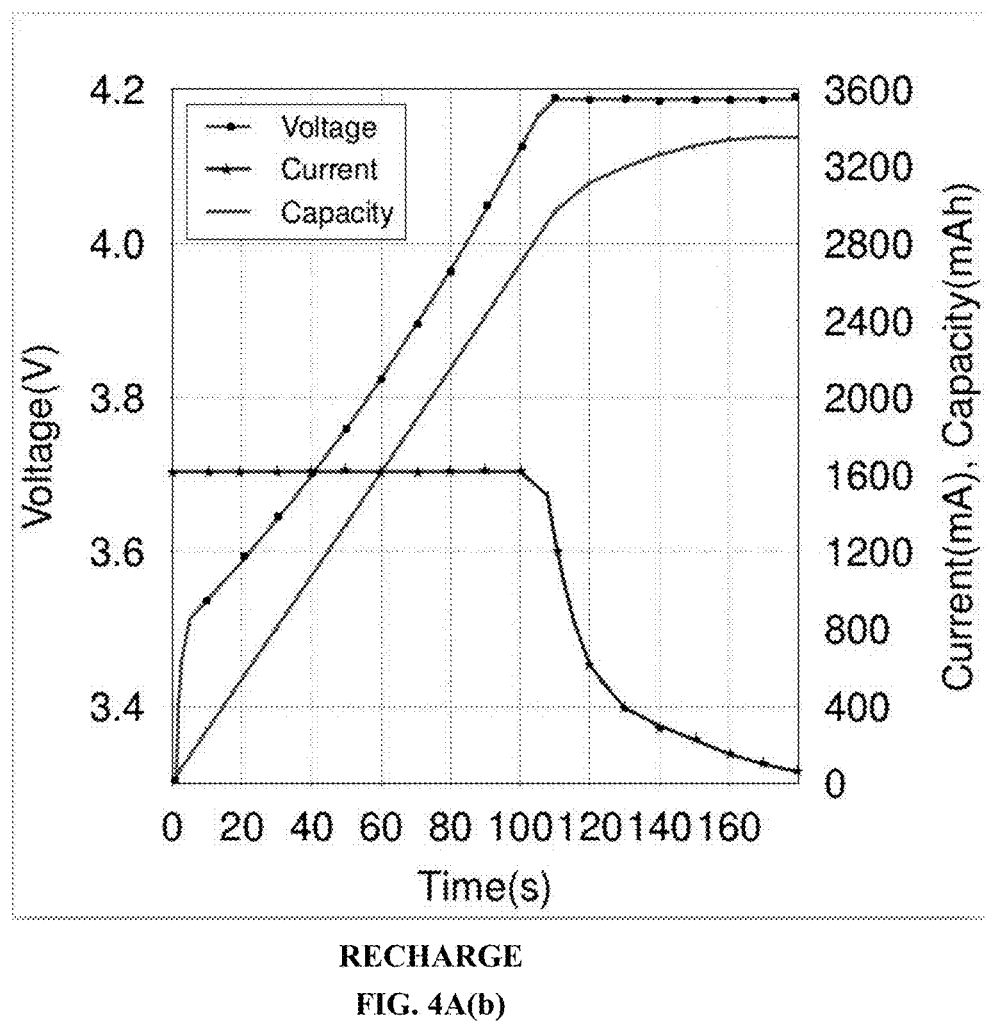

Battery modelling for EV model 204: The discharging and charging characteristics considered for the BEV are, for example herein, of Panasonic for cell model NCR18650B used by Tesla, as shown in FIG. 4a. From the data available in public forums it is inferred that the BEV consists of simple (74×96) cells organized in series (96) and parallel (74) to provide a design full-charge voltage of 400V. Note that the energy specification provided by Tesla for Model-S85 RWD, 85 kWh, is within the range of the nominal (3.6V*3200 mAh*96*74=81.8 kWh) and full charge (4.2V*3200 mAh*96*74=95.4 kWh) energies of the battery pack. Further, the rated voltage of 400V for the battery is consistent with the number of cells in series at a voltage of 4.2V (×96)=403.2V. The table 2 below provides notation for battery electrical model. Design constants (appearing first) are from Panasonic NCR18650B.

TABLE 2

| Symbol | Meaning | Value/Units |
|---|---|---|
| C | Rated capacity of battery | 3200 mAh |
| $V_B$ | Cell voltage (nominal) | 3.6 V |
| Vmax | Cell voltage (maximum) | 4.2 V |
| $N_P$ | Number of cells in parallel | 74 |
| $N_S$ | Number of cells in series | 96 |
| $r_c$ | Internal charging resistance per cell | Ohms |
| $R_B$ | Internal charging resistance of battery | Ohms |
| ∈(t) | SOC of battery at t | (%) |

Notation used for the battery modeling is summarized in Table 2. The Tesla BEV has $N_P*N_S$ cells are organized into NP parallel blocks with $N_S$ cells in series. Thus the overall internal resistance of the battery is given by $R_B=N_S*r_c/N_P$ and the overall nominal voltage of the battery is given by $V_B=V_C*N_S$. Note that the charging resistance of a cell is not the same as the discharging resistance in general, but used herein is the same notation $r_C$ to denote both for a cell. In reality, the battery pack is controlled by an intelligent battery management system to schedule the cells to be discharged (charged) for a given load (regeneration) power. However, purpose herein, we treat the battery pack as a homogeneous entity with all cells being discharged or charged at the same rate without any modeling of battery pack control.

Discharging: FIG. 4A (a) shows the discharging profile of the cell at specific currents available from the Panasonic NCR18650B specifications. Each curve shows the battery voltage $V_B$ (∈, $I_B$) at various levels of charge (SOC) ∈ for a constant discharge current $I_B$. Note that the open-circuit voltage of the battery $V_{OC}(\in)$ is a function of the SOC ∈ alone and independent of the discharge current $I_B$. Because voltage drops across the battery's internal resistance, the (terminal) battery voltage depends on the discharge current as $V_B=V_{OC}(\in)-R_B I_B$. The manufacturer's curves provide $V_B$ for only specific values of $I_B$. Need is to calculate $V_B$ as a function of and $I_B$ for arbitrary values of $I_B$. To do this, the value of $V_B$ between the voltages for the constant current curves $I_1$, $I_2$ is interpolated such that $I_1<I<I_2$. Specifically, for a given ∈, the assumption is that within the range $I_1$, $I_2$ the resistance is a constant.

Thus, $R_B(\in)$ is computed as $\{V_B(I1, \in)-V_B(I_2,\in)\}/(I_1-I_2)$, for two different currents values $I_1$ and $I_2$. For an arbitrary $I_B$, the $V_B$ can be estimated as $V_B (I_1)+(I_B-I_1)R_B$. The modeling also requires a few boundary conditions to be handled when $I_B$ falls outside the smallest and largest current curves provided by the manufacturer; not elaborated on them for the sake of brevity. This model is used for discharging the battery within the transport simulation.

Recharging: Unlike discharging, recharging in the BEV occurs in two modes: constant current and constant voltage. FIG. 4A (b) shows the recharging profile for the BEV. Till the voltage reaches a saturation voltage of 4.2V, the charging happens at a constant current; once the voltage exceeds this threshold, it charges in a constant voltage mode with so-called trickle charging. As before, a model is fitted to these sampled data points from the battery curves to estimate the charging equations for varying voltages and currents for our use in the simulator. This model is to estimate the demand on the electrical grid.

Battery state evolution: Given the SOC∈(t), needed is to calculate the new SOC∈(t+δ). From the physical model, the mechanical power $P_M(t)=P_M(v(t), a(t))$ can be obtained and from the efficiency at PM(t), the total electrical power $P_E(t)$ required as $P_M(t)/\eta(P_M(t))$. $P_M>0$ indicates discharging, while $P_M<0$ indicates regeneration.

Discharging: For discharging, the current drawn from the battery is calculated by solving the following equation for IB(t) given by equation 2:

$$[V_{OC}(\in(t))-I_B(t)\cdot R_B(t)]\times I_B(t)=P_E(t)] \quad (2)$$

So we can calculate $\in(t+\delta)$ as $\{\in(t)-(I_B(t)\times\delta)/C\}$, where C is the charge capacity of the battery (e.g. in mAh).

Regeneration: If the SOC is already high, recharging is not enabled and any regenerative power is dissipated in braking resistors or frictional braking is enabled. If the SOC is not high, and can still take in more charge, then the regenerated power needs to overcome the battery terminal voltage and internal resistance which is $V_{OC}+R_C \cdot I_C$ at a charging current of $I_C$. From the battery charging curve of Panasonic, the $R_C$ and $V_{OC}$ at a given SOC are obtained. Thus, given a regenerative power $P_E$ at a given SOC and if solved for $I_C$ such that $P_E=(V_{OC}+R_C \cdot I_C)I_C$. Note that for $P_E$; $V_{OC} \cdot R_C>0$, there is a unique positive solution to this equation. The boundary condition that we need to handle is to ensure that the charging voltage $V_{OC}+R_C I_C$ never exceeds the maximum cell voltage $V_{max}$ specified. If $P_E$ causes an increased cell voltage, the charging current at $I^*_C$ is cut off such that $V_{OC}+I^*_C RC=V_{max}$. The difference between $P_E$ and $V_{max}I^*_C$ is assumed to be lost in the braking resistors or in the mechanical braking.

HVAC Power: The HVAC power is accounted as follows: Tesla in their range calculator has a flag that specifies if the HVAC is turned off or not when driven at constant speed. For varying values of constant speeds, obtained is the overall energy consumption with and without HVAC energy consumption. From the data available, it is found that the mean HVAC energy consumption is around 1.516 KW (with a deviation of 3.8%). The model for discharging of battery is refined to include HVAC power if required.

Figure 4B:
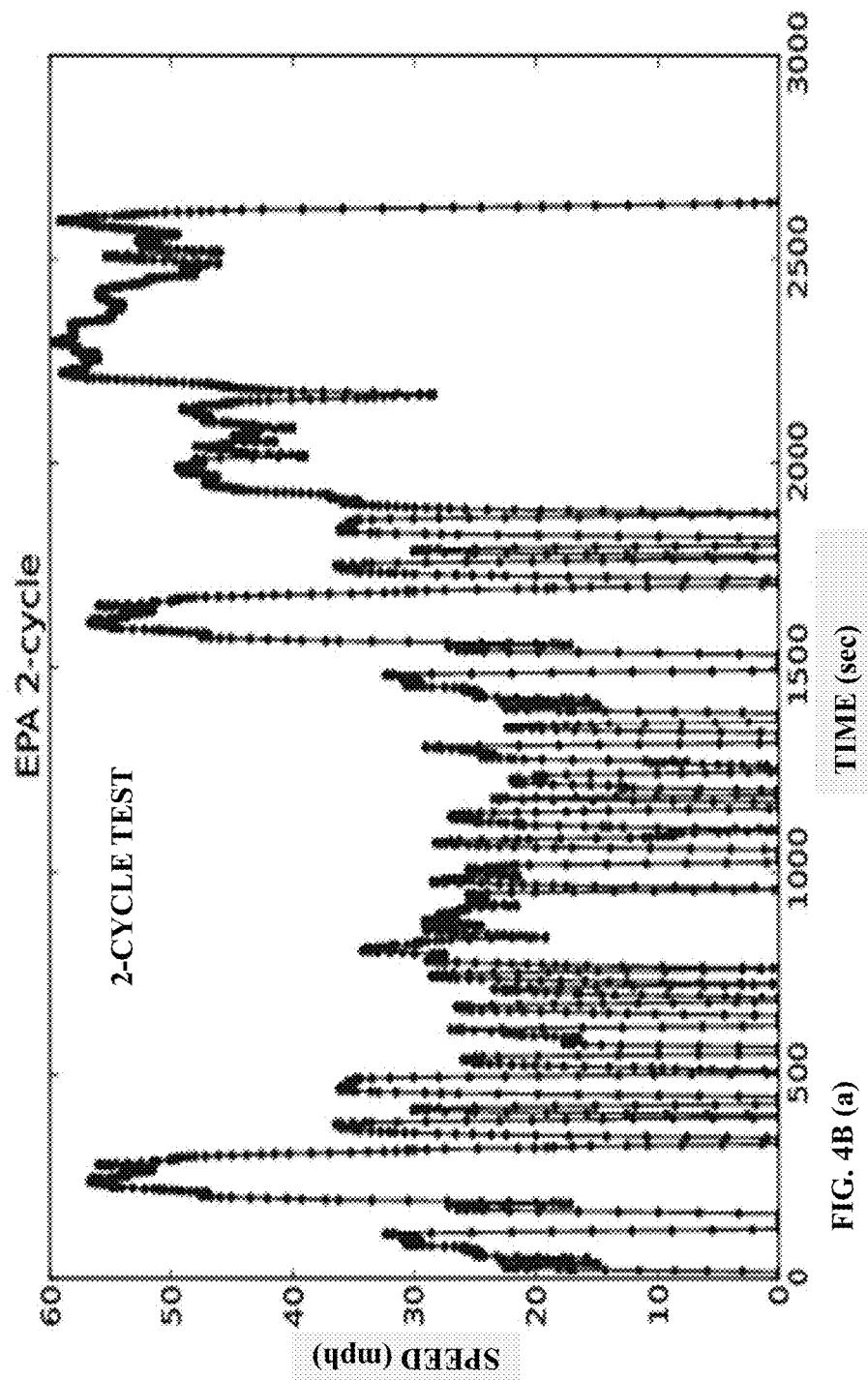
Figure 4B:
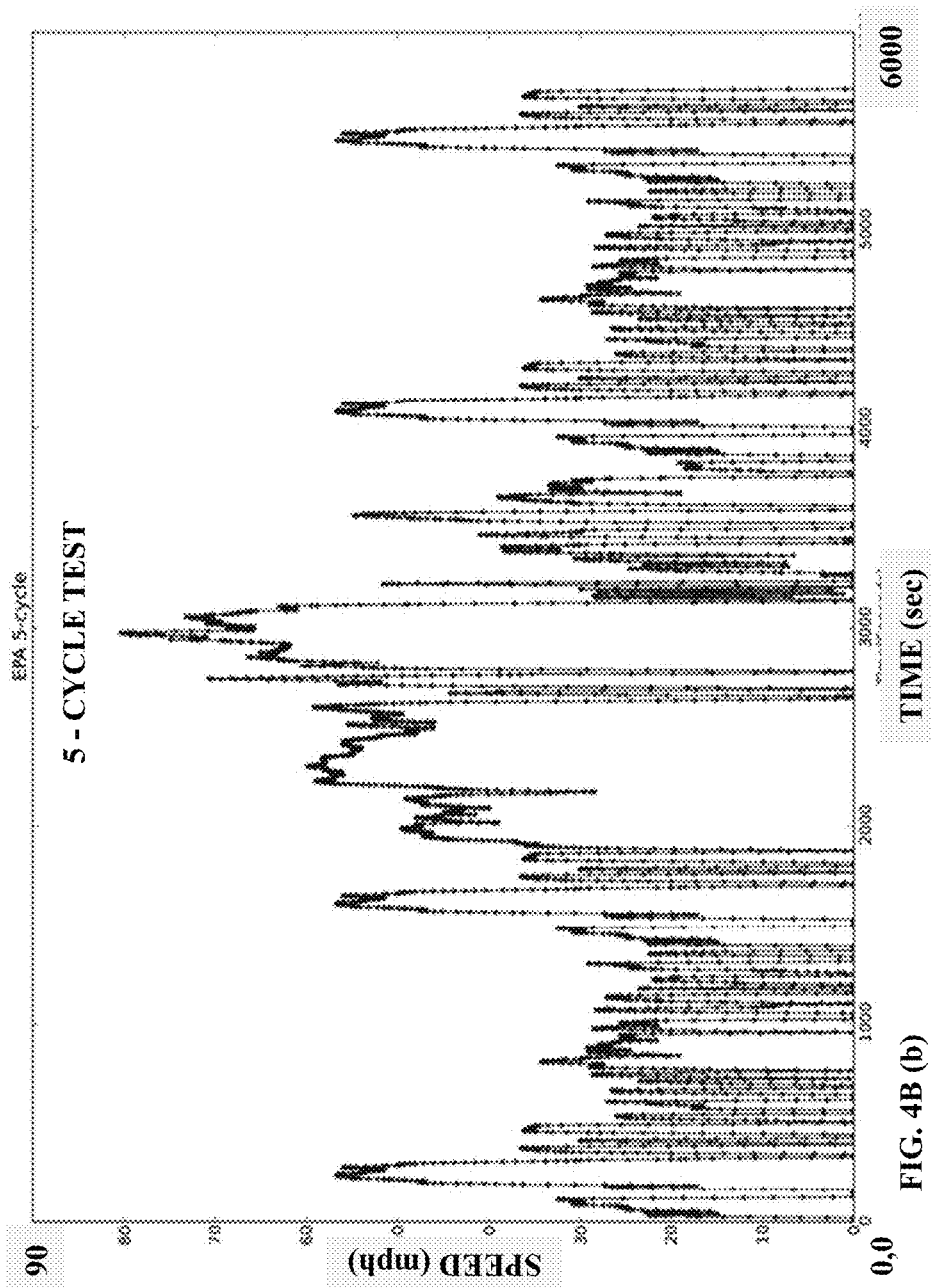

Validation of EV model 204: Three scenarios are considered: 1) Constant speeds; 2) US EPA 2-cycle test; and 3) US EPA 5-cycle test. Each EPA test specifies a building block pattern P of speed over time for a block of time T. The vehicle under test is driven according to P for a duration of T; and then the building block P starts all over again and continues as long as the vehicle does not meet the stopping criterion. FIGS. 4B (a) and 4B (b) show the building block P of the velocity profiles for the EPA 2-cycle and 5-cycle tests respectively. These tests are meant to represent a combination of city, highway, and sub-urban driving with and without HVAC usage; manufacturers are expected to report mileage over these tests. For each scenario, we consider the following metrics: 1) range till the battery reaches minimum SOC; 2) the time taken to complete the test; and 3) the battery capacity as measured by the net electrical power discharged from the battery. For each metric, the ground truth is established the ground truth as follows:

For the range, the ground truth is available from Tesla reported values for each of the test scenarios For the time taken to complete, the ground-truth is established as follows. For constant speed the time is obtained as the range divided by the speed. For varying speeds with pattern building block P it is proceeded as follows. Let dp(t) note the distance travelled in pattern P over time interval [0, t] for t∈[0, T]; where T is the duration of the pattern building block. Thus dp(T) is the range in one building block duration of T. Given a range R, the integral number of blocks of the pattern covered is $$n = \left\lfloor \frac{R}{dp(t)} \right\rfloor.$$

The residual distance in the last partial block is given by $\Delta R=R-ndpT$. Thus the time taken to empty is given by $nT+dp^{-1}\Delta R$. Finally, for the energy capacity of the battery 85 kWh is taken as the nominal value of the battery for all the tests. For the model, the net energy discharged by the battery is obtained after accounting for regeneration.

Figure 4C:
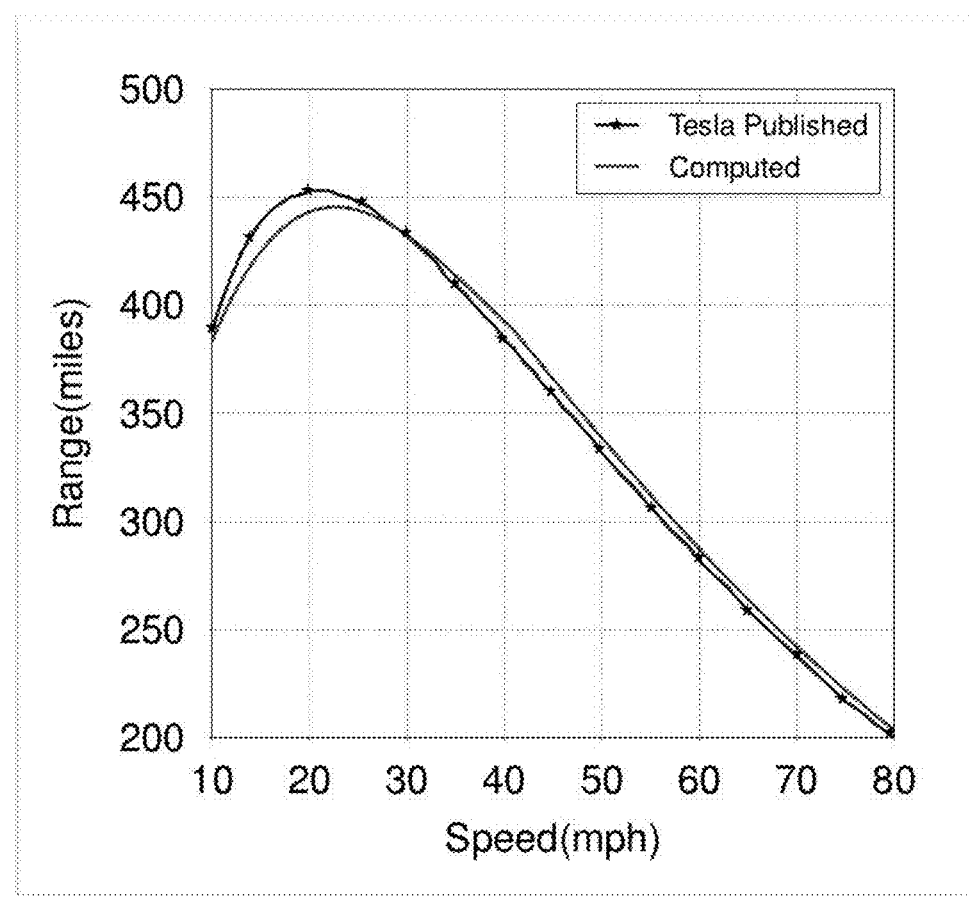

Further, $\eta D(v, a)=0.9$ is used irrespective of acceleration and for the regenerative braking efficiency $\eta R=0.7$ is used. The physical constants given in Table 1 are used for building the physical model. Under these assumptions about $\eta D$ and $\eta R$, obtained is constant-speed profiles. Specifically, for a given speed, the range (distance to empty at 95% discharge of the battery) is found. This is performed for various speeds to obtain the range as a function of speed. FIG. 4C shows a comparison between the ranges achieved for various speeds as per our model; and those given by Tesla. The two curves match closely with an average absolute relative error of 1.83% and a maximum error of 3.17%. Also can be observed that the net electrical energy discharged by the battery as shown in Table 3 is close to the battery capacity.

TABLE 3

| Metric Experiment | Range-Actual (miles) | Range-Model (miles) | Error (%) | Time-Actual (hours) | Time-Model (hours) | Error (%) | Battery-Actual (kWh) | Battery-Model (kWh) | Error (%) |
|---|---|---|---|---|---|---|---|---|---|
| Constant Speed | 204.6/447.5 | 200/453 | 1.83 | 2.5-37.69 | 2.5-38.82 | 0.04-3.12 | 85 | 81-83.5 | 6.51 |
| EPA 2-cycle | 320 | 298.52 | −6.7 | 11.01 | 10.29 | 6.53 | 85 | 78.68 | −7.4 |
| EPA 5-cycle | 265 | 271.91 | 2.6 | 9.56 | 9.96 | 4.18 | 85 | 78.2 | −8 |

This suggests that the choice of efficiencies and physical modeling is reasonably accurate when there is no acceleration. In the EPA 2-cycle test, the net energy discharged from the battery is close to the actual. However, the range is underestimated, this suggests that the disclosed recharging model is not aggressive or the efficiency value used for recharging the battery is lower than actual. For the EPA 5-cycle test, it is observed that while the recharging model is the same, the range is over-estimated (2:6%). This may be due to the HVAC power obtained was assumed to be constant, but in reality, it could depend on speed and acceleration. While the model parameters can be further tweaked, the errors are tolerable enough for a realistic EV model.

EV model 204 integration with SUMO (transport simulator 202): The EV model is added to the SUMO by modifying the vehicle (MSVehicle) and the microsimulator (MSNet) classes of the SUMO. The EVs physical and battery models are expressed as two classes: TeslaPowerModel and TeslaBatteryModel. The physical model translates a given (v(t), a(t)) pair to the electrical power required to be supplied by the battery. The battery class keeps track of the battery's SOC and translates the electrical power requirement to corresponding change in the battery SOC. These classes are added as member variables in the MSVehicle class. The default car following model of SUMO is used. The microsimulator iterates each active vehicle in a time-stepped loop to move them along a road. The speed and acceleration of such a movement is decided by the car following model. When the speed and acceleration of a time-step is computed, the simulator invokes the physical and battery objects of the vehicle and updates the battery SOC. It then moves the vehicle to its new position. If the battery SOC falls below the minimum threshold, the vehicle is flagged and is removed from the network.

Example Real-world traffic models for SUMO: LuST (Luxembourg SUMO Traffic Scenario) is a SUMO scenario that simulates the traffic in the city of Luxembourg for a duration of 27 hours. The scenario covers about 931 km of roads in an area of 156 km2. It synthesizes realistic demographics, mobility patterns and traffic demand from the demographic data (e.g. population, age distribution) published by the Luxembourg government and a mobility study that describes traffic characteristics over recent years. The simulation inserts approximately 176,000 vehicles during the simulation time period. The cumulative distance traveled by the vehicles is about 1.7 million kilometers.

The number of issues encountered during the simulation (e.g. teleportation, collisions, emergency stops) is less than 0.05%, thereby demonstrating that no gridlocks or bottlenecks occur during the simulation. With respect to the calibration of the simulation results, the results show that the average length of a trip is about seven kilometers, and the average vehicle speed is approximately 10 m/s. A known method has confirmed that this is in agreement with on-the-ground observation of the time required to travel from a neighborhood to the city center in Luxembourg. Thus, the system 100 disclosed utilizes the aforesaid traffic model with SUMO to study the impact of EVs on Luxembourg's electrical grid. Because the traffic model has been calibrated and validated, the vehicular patterns realized in the simulation study will be reasonably realistic.

Experimental setup: The geographical region for which real-world traffic data is available covers the city of Luxembourg and its surrounding areas, also referred as Greater Luxembourg city. For purpose of evaluation, this region is divided into 725 cells of size 500 m×500 m. This cell size has been chosen so that it approximates a neighborhood (comprising a few streets). The reports published by CREOS, Luxembourg's national electric utility, indicate that Luxembourg is a winter peaking jurisdiction. From the demand profile of a typical Luxembourg winter day, it is understood that the peak demand for all of Luxembourg is around 753.9 MW. This demand profile occurred when there was negligible EV penetration. The baseline demand for a single 500×500 m cell as is calculated as follows. The entire state of Luxembourg has a population of about 562958 while the Greater Luxembourg city area has a population of about 112600. So, it is estimated that the peak demand of the Greater Luxembourg area as 150:78 MW. This is divided across the cells to obtain a (500×500 m) cell's baseline peak demand. It is assumed that the electrical grid's distribution infrastructure in each cell is provisioned to meet this peak demand.

EV selection and charging: Out of the 176000 cars in the Greater Luxembourg area, randomly X % of the vehicles are identified as EVs, where X is the desired EV penetration level. The EVs recharge during the course of the simulation based on the plurality of charging policies, predefined by the system 100. Thus, aggregating the load demand is based on the plurality of predefined charging policies comprising the End of Day, Home (EOD-H) charging policy and the Home and Away (HAA (q, ε)) charging policy. The HAA (q, ε) charging policy comprises a plurality of levels differentiated based on the plurality of levels of q providing unique EV penetration levels and a plurality of levels of ε providing the unique SOC thresholds indicating an minimum SOC an EV user is comfortable with.

a) The EOD-H charging policy: Tesla observes that EV owners charge their vehicle every day at the end of all trips. The EVLD model 114 assumes that such charging happens at the home of an EV owner. The location where an EV gets parked at the end of a day after all trips is considered to be the home.

b) Probabilistic, the HAA charging policy: Studies have shown that while 84% of all EV charging happens at home, only 13% of EV owners charge exclusively at home. So a scenario is considered where a certain percentage q, 0≤, q≤100%, of the EV's are charged only at homes. The charging behavior of these owners is as per EOD-H. The remaining (100−q) percentage of EV owners charge at home as well as other charging locations. An EV owner may not charge their vehicle at the end of every trip (there may be several trips during a day). The choice of an EV owner to charge her/his vehicle depends on the state-of-charge of the EV battery—lower the state of charge, higher the likelihood. This behavior is modelled probabilistically as follows:

$$P(\text{charging}) = \begin{cases} \dfrac{1 - SOC}{1 - \varepsilon}, & \text{if } SOC \geq \varepsilon \\ 1, & \text{otherwise} \end{cases} \quad (3)$$

Where, ε is the lowest or minimum SOC (the SOC threshold) that the EV user (owner) is comfortable with. Under this policy, it is assumed that EV chargers are present at all locations where a vehicle may park after any of its trips. Hence forth, this policy is referred as HAA (q, ε) for given values of q and EV Charger characteristics: The load of an individual EV depends on the EV charger's power rating. Presently, chargers with different power ratings exist: 3:3 kW, 5 kW, 9:6 kW, 20 kW and Tesla's 40 kW super-charger. It is assumed that the chargers have a median rating of 9:6 kW. When the EV charges, the charging load is added to the cell where the charging occurs. Note that when an EV is charging, its charging load need not be constant. The load may vary with time depending on the mode of charging—constant current or constant voltage, which in turn depends on the battery's SOC at a given instant. The details are modelled in simulation.

Figure 4D:
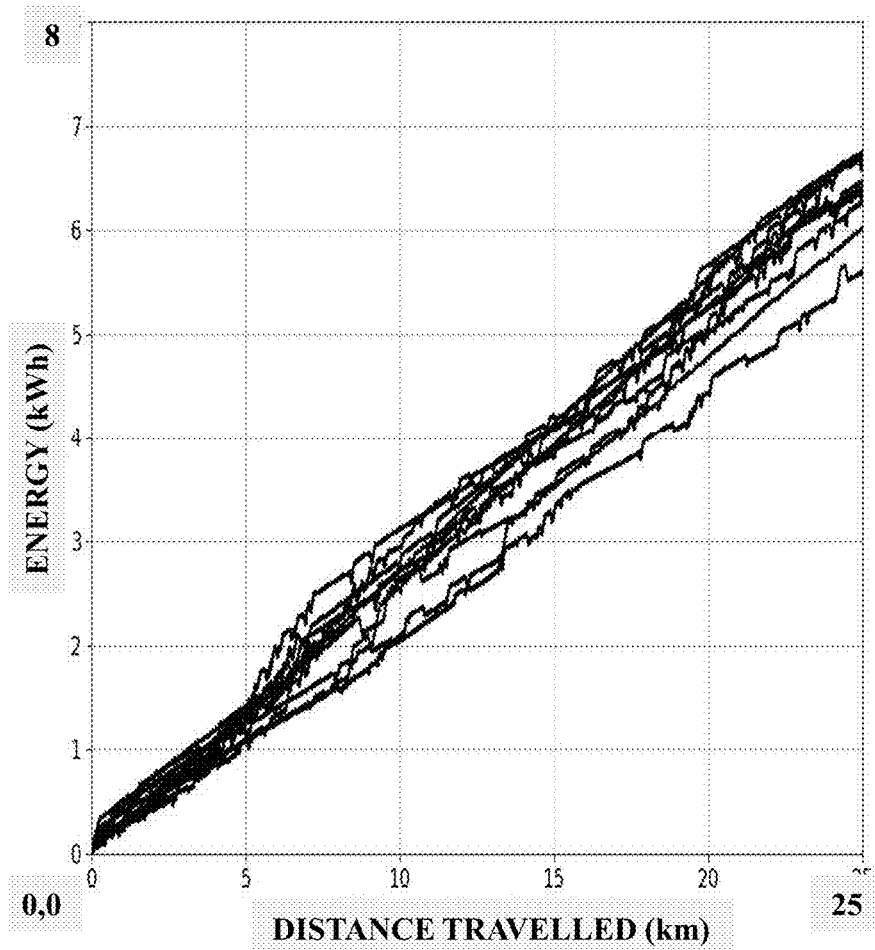

Simulations performed: The impact of EVs on the electrical grid under five different EV penetration levels of 5%; 10%; 15%; 20% and 25%. Once the EVs are selected randomly, the traffic simulation (consisting of both EVs and other vehicles) is run for 60 consecutive days to mitigate the effects of any initial transients that may exist (i.e., post a burn-in period). Each EV starts the simulation from a fully charged battery and recharges during the simulation as per the charging policy. For each penetration level, ten different charging policies are simulated including EOD-H and HAA (q, ε) for three q values of 25%; 50%; and 75% and three ε values of 0:2; 0:5 and 0:8. Thus, nine different HAA (q, ε) variants are available. From this combined transport and EV simulation, the spatial distribution (i.e., in each cell of the greater Luxembourg area) of the EV load at all times is obtained Results: Existing methods have used average metrics such as the distance traveled as a proxy for EV energy consumption over some period of time. As mentioned before, because the power consumed by an EV is non-linear in the velocity and acceleration, as provided in equation 1b, this approximation may not be valid. FIG. 4D shows the results of considering distance travelled as an approximation for energy consumed. The X-axis shows the distance travelled and the Y-axis the energy consumed by different EVs in the simulator. It is observed that there is around 20% variation of the energy consumed for the same distance. This in turn, will affect the demand on the grid since the duration for which an EV may appear as a load on the grid and the time instances at which it appears as a load will get affected due to this error. So it would help to trace the energy consumed by each EV individually to get a reliable estimate of the demands.

Figure 4F:
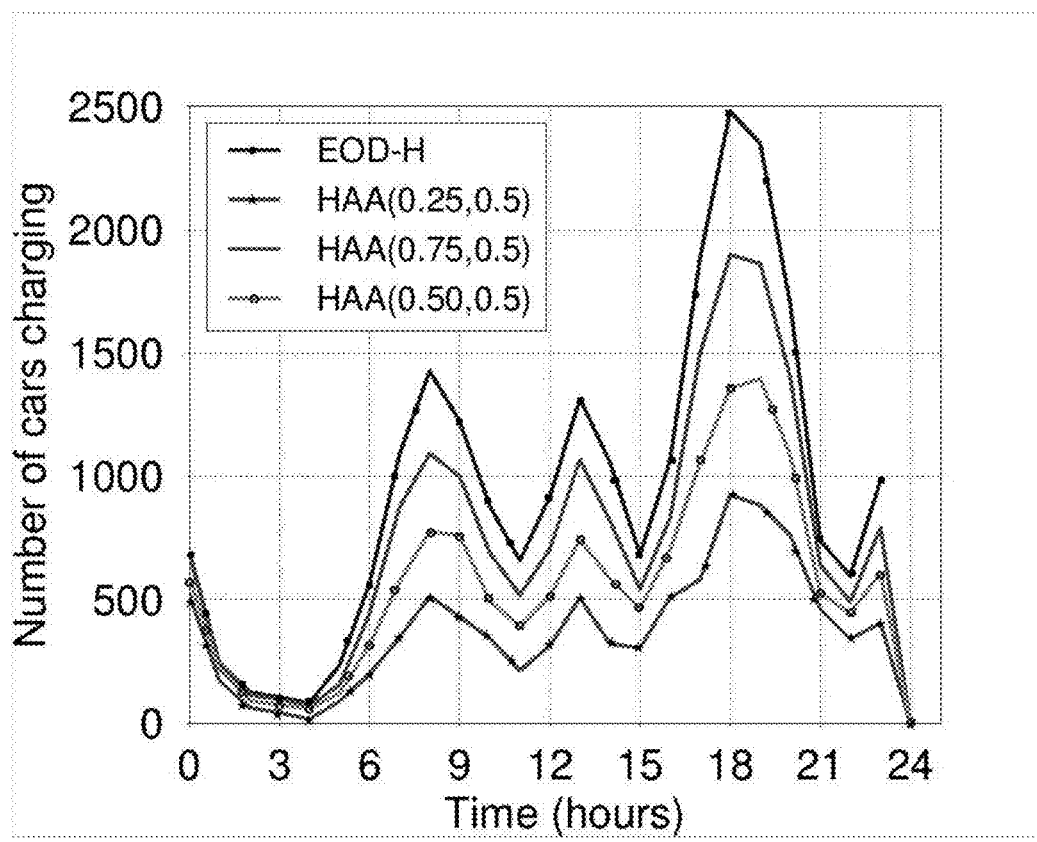

Aggregate EV charging load (EV load demand): Aggregating the EV load demand is based on a plurality of predefined charging policies comprising the End of Day, the Home (EOD-H) charging policy and the Home and Away (HAA (q, ε)) charging policy. The HAA (q, ε) charging policy further comprises plurality of levels differentiated based on the plurality of levels of q providing unique EV penetration levels and the plurality of levels of ε providing the unique SOC thresholds indicating the minimum SOC an EV user is comfortable with. FIG. 4E (a) shows the base demand (without EVs) for the entire Greater Luxembourg area. FIGS. 4E(b) and 4E(c) show the sum of the base demand and EV charging load for EV penetration levels of 15% and 25% respectively. Though the traffic simulation and hence power levels of EVs are updated every second, the EV demands are averaged over 15 minute intervals. Chosen are 15 minute intervals because utilities typically estimate demands (especially for peak demand charging) and dispatch generation at 15 minute windows. The aggregate EV load is shown under four different charging policies—namely EOD-H, HAA (0:25; 0:5), HAA (0:5; 0:5) and HAA (0:75; 0:5). The graphs shown here correspond to one simulation day (after the burn-in period). Following observations are made. Under all charging policies, EV's increase the grid's aggregate peak. Thus EV charging does happen during the peak times of the base demand. As expected, the EV load increases with increasing EV penetration levels. Among the charging policies considered, for a given EV penetration level, EOD-H increases the grid's peak by the highest amount. Under the EOD-H charging policy, all the EV owners charge at the end of all their trips in a day. If the end times of the last trips coincide with the peak time of the grid's base demand, the grid's overall demand will increase. FIG. 4F shows the number of EVs that are charging at various times of the day across all EV users. It is noted that the EV count peaks under EOD-H around 18:45 hours which coincides with the peak time of the base load shown in FIG. 4E (a). In the HAA (,) family of policies, due to probabilistic charging, not all users charge every day and users who charge their EVs in a given day may not do so at the end of their last trip. This can be seen from the FIG. 4F. Consequently, the aggregate peak demand of the grid does not increase by much under these policies. Thus it is identified that at 25% EV penetration, the aggregate grid demand increases by 20 MW, which corresponds to a modest relative increase of 13%.

Spatial distribution of EV load: The analysis for how the EV charging load is distributed spatially across various cells and the relative impact on the peak base demand of each cell is provided. FIGS. 4G (a) and 4G (b) show the total demand at given cell (#253) including EV charging for EV penetration levels of 15% and 25% respectively. The total demand is given for four different charging policies: EOD-H, HAA (0:25; 0:5), HAA (0:5; 0:5), and HAA (0:75; 0:5). For ease of comparison, the plots also indicate the baseline peak demand of 0:753 MW for a cell (without any EV charging). We note that with EV charging, the new peak demand at an individual cell can significantly exceed the baseline peak. For cell #253 whose demand is shown in the figures, the relative increases in the peak demand for EV penetration levels of 15% and 25% are 51% and 77% respectively. Such high increases in the cell-level peak demand stands in sharp contrast to the modest 13% increase observed in the aggregate peak. This suggests that obtaining the spatial distribution of EV loads is essential for proper grid provisioning.

Duration of high demand periods: For the cells that have significantly higher demand, the durations of high demand are examined. If the increased demands are transitory, then the existing distribution infrastructure may not get affected much. On the other hand, if these periods are persistent, then the distribution infrastructure may get affected because of thermal events (over-heating of cables and transformers). In this case, the utility may need to invest to enhance the existing infrastructure in the affected cells. An indicator variable Ic(t) is defined that indicates if the total demand at cell c has increased significantly during a 15 minute time slot t. An increase in demand is labelled as significant if the new demand is more than 1:30 times the base peak. We choose an overload threshold of 30% since grid assets such as transformer fuses may be able to absorb up to 130% overload in the presence of appropriate insulation without affecting the asset's life expectancy [26]. Formally, $$I_C(t) = \begin{cases} 1, & \text{if } \dfrac{P_C(t) - EV_C(t)}{1 - \varepsilon} \geq 1.3 \\ 0, & \text{otherwise} \end{cases} \quad (4)$$

Where, Pc(t) and EVc(t) are the base demand and EV charging load respectively at time slot t in cell c. PG is the baseline peak demand. For a given cell c, the fraction of Ic(t) values that become 1 across all t gives the duration of time that c experiences high demand. Table 4 gives the top five cells ordered in terms of the durations of high demand (in minutes per day) when averaged under different charging policies for 25% EV penetration.

TABLE 4

| Rank | Cell # | Duration (mins per day) |
|---|---|---|
| 1 | 253 | 107 |
| 2 | 410 | 88 |
| 3 | 544 | 75 |
| 4 | 501 | 71 |
| 5 | 358 | 67 |

Figure 4H:
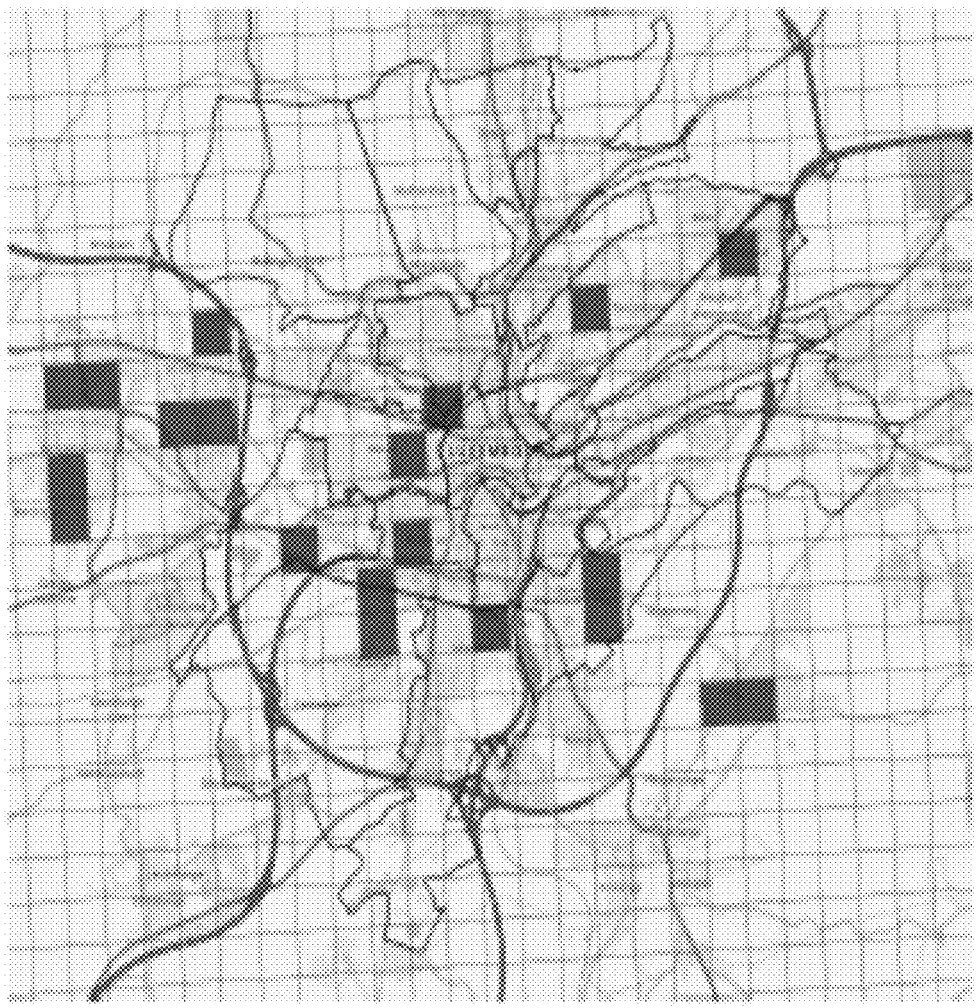
Figure 4I:
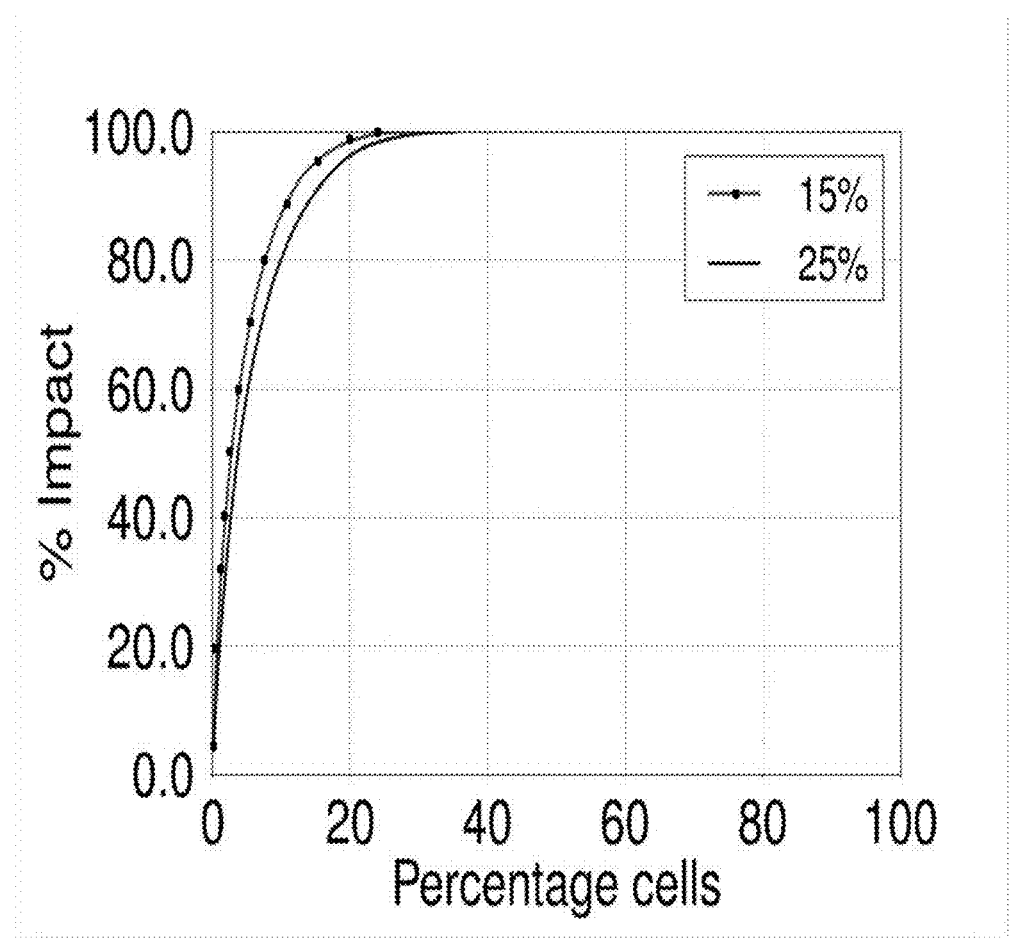

In the current scenario, the utility CREOS typically estimates the downtime as around 10 minutes per year. The increased demand due to EV charging is not transitory, but persists for a longer duration across the top ranked cells. This implies the repeated fuse blow-outs and/or overheating can happen in the transformers that serve these neighborhoods. These in turn can not only increase the downtime, but also reduces the asset life expectancy. Typically, cells that are geographically clustered together may share a common upstream distribution network infrastructure. Therefore, if the top impacted (i.e., overloaded) cells are all clustered together, the common upstream infrastructure may also need to be enhanced in addition to the infrastructure inside the affected cells. FIG. 4H shows the geographical distribution of the top twenty cells overlaid on the map of Greater Luxembourg area. The top affected cells are not clustered but spatially well separated. Therefore, the utility may not need to invest in infrastructure beyond the affected cells. Prioritizing enhancement across cells. Given that EV charging affects several cells, further analysis is done to study if there is any skew in terms of the impact across cells. A cell's impact is defined to be duration in minutes per day over which its demand increases significantly from the base demand. Network wide impact would then be the sum of impact of individual cells. FIG. 4I shows what fraction of cells contribute to what fraction of the overall impact. It is observed that there is a skew in terms of the impact. For a 15% EV penetration, roughly 10% of the cells contribute to 88% of the impact. For a 25% EV penetration, the skew decreases with 10% of the cells contributing to 81:5% of the impact. This is understandable since as EV penetration increases, additional cells get affected which brings down the skew, while increasing the overall affected duration.

Figure 3:
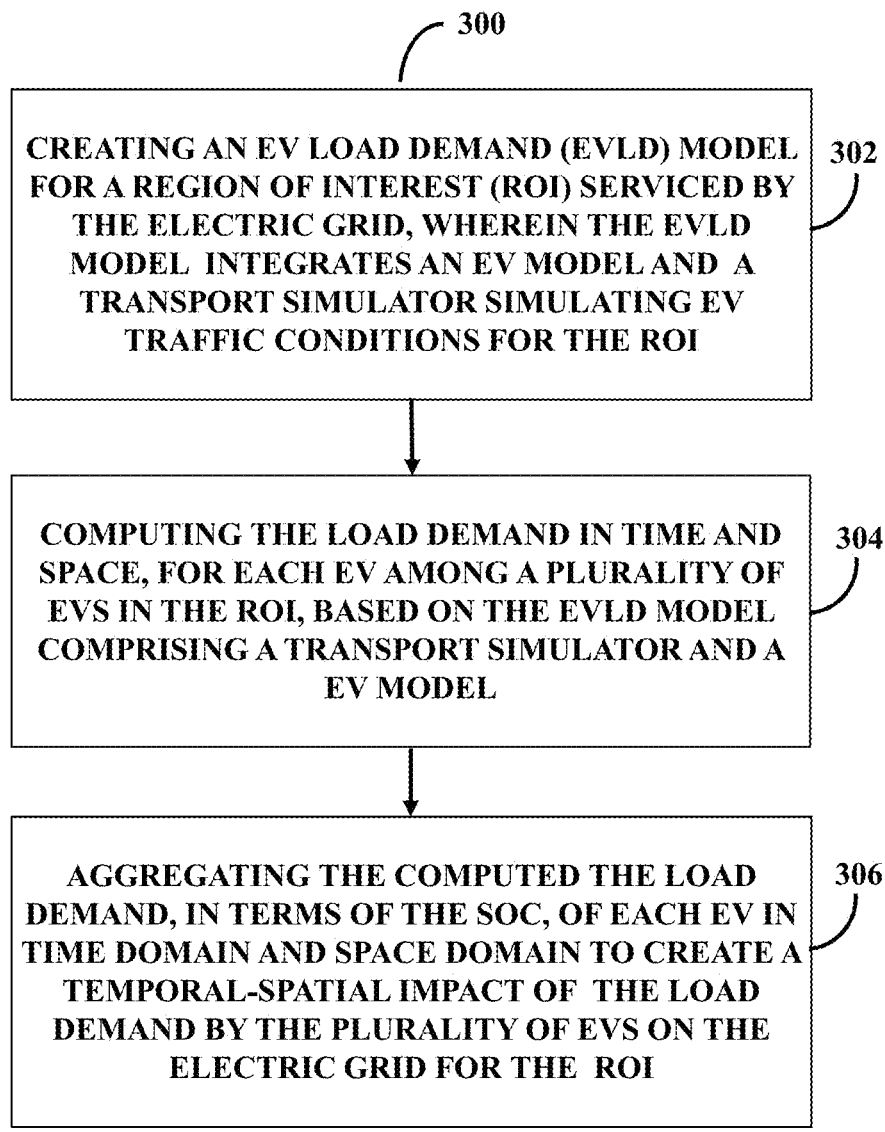
FIG. 3 is a flow diagram illustrating a method providing temporal-spatial prediction of load demand using the EVLD model, in accordance with some embodiments of the present disclosure.

FIG. 3 is a flow diagram illustrating a method 300 providing temporal-spatial prediction of load demand based on the EVLD model 114, in accordance with some embodiments of the present disclosure.

In an embodiment, the system 100 includes one or more data storage devices or memory 104 operatively coupled to the one or more processors 102 and is configured to store instructions configured for execution of steps of the method 300 by the one or more processors 102. The steps of the method 300 will now be explained in detail with reference to the components of the system 100 of FIG. 1. Although process steps, method steps, techniques or the like may be described in a sequential order, such processes, methods and techniques may be configured to work in alternate orders. In other words, any sequence or order of steps that may be described does not necessarily indicate a requirement that the steps be performed in that order. The steps of processes described herein may be performed in any order practical. Further, some steps may be performed simultaneously. At step 302, the method 300 enables providing the EVLD model 114 by integrating the transport simulator 202, providing micro simulation of traffic for the ROI integrated with the EV model 204 providing EV models for each EVs in the ROI considered by the transport simulator 202. At step 304, the method includes enabling the EVLD model 114 to compute the load demand in time and space in terms the SOC of the battery for each EV among the plurality of EVs in the ROI utilizing the transport simulator 202 integrated with the EV model 204. The transport simulator 202 is configured to tracks location of each EV of the ROI in space domain and time domain in terms velocity and acceleration of the corresponding EV at regular time windows at every location among a plurality of location traversed by the EV. The tracking is based on the traffic conditions of the ROI simulated by the transport simulator 202. Further, the EV model 204 is configured to provide load demand of each EV in time domain in terms of the SOC of the battery for a corresponding EV for a corresponding time window among the regular time windows. The SOC is estimated based on the velocity and the acceleration of the corresponding EV for the corresponding time window. The EV model 204 comprises the mechanical model 206 coupled to the electrical model 208 providing load demand of each EV in terms of SOC of the battery of each EV. The EV model 204 is configured to compute the SOC of the battery for each EV by estimating, using the mechanical model 206, the mechanical power ($P_{M(t)}$) of each EV for each time window based on the velocity and the acceleration of the corresponding EV for the corresponding time window. Further, the electrical model 208 is configured to estimate the equivalent electrical power ($P_{E(t)}$) of the mechanical power ($P_{M(t)}$) for each EV for the corresponding time window. The estimated electric power ($P_{E(t)}$) corresponds to the discharging power draining the battery if the computed mechanical power is greater than zero, while the computed electric power ($P_{E(t)}$) corresponds to the regenerative power charging the battery if the computed mechanical power (NO is less than zero. Further, the electrical model 208 is configured to update the SOC of the battery of the corresponding EV for the corresponding time window based on whether the computed equivalent electrical power ($P_E(t)$) is the regenerative power or the discharging power.

Upon computation of the SOC (updated or current SOC) of each EV in time and space, at step 306, the method 300 includes enabling the EVLD model 114 to aggregate the computed the load demand, in terms of the SOC, of each EV in time domain and space domain to create the temporal-spatial impact of the load demand by the plurality of EVs on the electric grid for the ROI. Aggregating the computed the load demand is based on the plurality of predefined charging policies comprising the End of Day, Home (EOD-H) charging policy and the Home and Away (HAA (q, ε)) charging policy. The HAA (q, ε) charging policy further comprises the plurality of levels differentiated based on the plurality of levels of q providing unique EV penetration levels and the plurality of levels of ε providing the unique SOC thresholds indicating the minimum SOC the EV user is comfortable with. The method 300 can further to be understood with the example described in conjunction with FIG. 2 and not repeated, to maintain brevity.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g.

an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for predicting temporal-spatial distribution of load demand on an electric grid due to a plurality of Electric Vehicles (EVs), the method comprising:
   creating an EV load demand (EVLD) model for a Region of Interest (ROI) serviced by the electric grid, wherein the EVLD model integrates an EV model and a transport simulator simulating EV traffic conditions for the ROI (302); and
   computing the load demand in time and space in terms of State of Charge (SOC) of a battery for each EV among the plurality of EVs in the ROI, based on the EVLD model (304), wherein:
   the transport simulator tracks location of each EV of the ROI in space domain and time domain in terms velocity at time t and acceleration of the corresponding EV over t+δ at regular time windows at every location among a plurality of location traversed by the EV based on the traffic conditions of the ROI simulated by the transport simulator; and
   the EV model provides load demand of each EV in time domain in terms of the SOC of the battery for a corresponding EV for a corresponding time window among the regular time windows, wherein the SOC is estimated based on the velocity and the acceleration of the corresponding EV for the corresponding time window and the EV model computes a new SOC (t+δ) depending on energy spent over [t, t+δ];
   aggregating the computed the load demand, in terms of the SOC, of each EV in time domain and space domain to create a temporal-spatial impact of the load demand by the plurality of EVs on the electric grid for the ROI (306), wherein the EVLD model utilizes a mechanical model to compute a mechanical power ($P_{M(t)}$) from the velocity and the acceleration of each EV and translating the mechanical power ($P_{M(t)}$) to an equivalent electrical power ($P_{E(t)}$) by an efficiency function η(v, a) as $P_{E(t)} = P_{M(t)}/\eta(v, a)$, wherein v denotes the velocity and a denotes the acceleration.

2. The method as claimed in claim1, wherein the EV model comprises the mechanical model coupled to the electrical model providing load demand of each EV in terms of SOC of the battery of each EV.

3. The method as claimed in claim 1, wherein computing the SOC of the battery for each EV comprises:
   estimating, by the mechanical model of the EV model, the mechanical power ($P_{M(t)}$) of each EV for each time window among the time windows based on the velocity and the acceleration of the corresponding EV for the corresponding time window;
   estimating, by the electrical model of the EV model, the equivalent electrical power ($P_{E(t)}$) of the mechanical power ($P_{M(t)}$) for each EV for the corresponding time window, wherein the estimated electric power ($P_{E(t)}$) corresponds to a discharging power draining the battery if the computed mechanical power is greater than zero, and the computed electric power ($P_{E(t)}$) corresponds to a regenerative power charging the battery if the computed mechanical power ($P_{M(t)}$) is less than zero; and
   updating the SOC of the battery of the corresponding EV for the corresponding time window based on whether the computed equivalent electrical power ($P_{E(t)}$) is the regenerative power or the discharging power.

4. The method as claimed in claim 1, wherein aggregating the computed the load demand is based on a plurality of predefined charging policies comprising an End of Day, Home (EOD-H) charging policy and a Home and Away (HAA (q, ε)) charging policy, wherein the HAA (q, ε)

charging policy further comprises a plurality of levels differentiated based on a plurality of levels of q providing unique EV penetration levels and a plurality of levels of ε providing unique SOC thresholds.

5. A system (100) for predicting temporal-spatial distribution of load demand on an electric grid due to a plurality of Electric Vehicles (EVs), the system comprising:
a memory (104) operatively coupled to one or more hardware processors (102) and configured to store instructions configured for execution by the one or more hardware processors to:
create an EV load demand (EVLD) model for a Region of Interest (ROI) serviced by the electric grid, wherein the EVLD model integrates an EV model and a transport simulator simulating EV traffic conditions for the ROI; and
compute the load demand in time and space in terms of State of Charge (SOC) of a battery for each EV among the plurality of EVs in the ROI, based on the EVLD model, wherein:
the transport simulator tracks location of each EV of the ROI in space domain and time domain in terms velocity at time t and acceleration of the corresponding EV over t+δ at regular time windows at every location among a plurality of location traversed by the EV based on the traffic conditions of the ROI simulated by the transport simulator; and
the EV model provides load demand of each EV in time domain in terms of the SOC of the battery for a corresponding EV for a corresponding time window among the regular time windows, wherein the SOC is estimated based on the velocity and the acceleration of the corresponding EV for the corresponding time window and the EV model computes a new SOC (t+δ) depending on energy spent over [t, t+δ];
aggregate the computed the load demand, in terms of the SOC, of each EV in time domain and space domain to create a temporal-spatial impact of the load demand by the plurality of EVs on the electric grid for the ROI), wherein the EVLD model utilizes a mechanical model to compute a mechanical power ($P_{M(t)}$) from the velocity and the acceleration of each EV and translating the mechanical power ($P_{M(t)}$) to an equivalent electrical power ($P_{E(t)}$) by an efficiency function η(v, a) as $P_{E(t)} = P_{M(t)}/\eta(v, a)$, wherein v denotes the velocity and a denotes the acceleration.

6. The system (100) of claim 5, wherein the EV model comprises the mechanical model coupled to the electrical model providing load demand of each EV in terms of SOC of the battery of each EV.

7. The system (100) of claim 5, wherein computing the SOC of the battery for each EV comprises:
estimating, by the mechanical model of the EV model, the mechanical power ($P_{M(t)}$) of each EV for each time window among the time windows based on the velocity and the acceleration of the corresponding EV for the corresponding time window;
estimating, by an electrical model of the EV model, an equivalent electrical power $P_{E(t)}$ of the mechanical power ($P_{M(t)}$) for each EV for the corresponding time window, wherein the estimated electric power ($P_{E(t)}$) corresponds to a discharging power draining the battery if the computed mechanical power is greater than zero, and the computed electric power ($P_{E(t)}$) corresponds to a regenerative power charging the battery if the computed mechanical power ($P_{M(t)}$) is less than zero; and updating the SOC of the battery of the corresponding EV for the corresponding time window based on whether the computed equivalent electrical power ($P_{E(t)}$) is the regenerative power or the discharging power.

8. The system (100) of claim 5, wherein aggregating the computed the load demand is based on a plurality of predefined charging policies comprising an End of Day, Home (EOD-H) charging policy and a Home and Away (HAA (q, ε)) charging policy, wherein the HAA (q, ε charging policy further comprises a plurality of levels differentiated based on a plurality of levels of q providing unique EV penetration levels and a plurality of levels of ε providing unique SOC thresholds.

9. A non-transitory computer readable medium storing instructions which, when executed by a hardware processor, cause the hardware processor to perform acts comprising:
creating an EV load demand (EVLD) model for a Region of Interest (ROI) serviced by the electric grid, wherein the EVLD model integrates an EV model and a transport simulator simulating EV traffic conditions for the ROI; and
computing the load demand in time and space in terms of State of Charge (SOC) of a battery for each EV among the plurality of EVs in the ROI, based on the EVLD model, wherein:
the transport simulator tracks location of each EV of the ROI in space domain and time domain in terms velocity at time t and acceleration of the corresponding EV over t+δ at regular time windows at every location among a plurality of location traversed by the EV based on the traffic conditions of the ROI simulated by the transport simulator; and
the EV model provides load demand of each EV in time domain in terms of the SOC of the battery for a corresponding EV for a corresponding time window among the regular time windows, wherein the SOC is estimated based on the velocity and the acceleration of the corresponding EV for the corresponding time window and the EV model computes a new SOC (t+δ) depending on energy spent over [t, t+δ];
aggregating the computed the load demand, in terms of the SOC, of each EV in time domain and space domain to create a temporal-spatial impact of the load demand by the plurality of EVs on the electric grid for the ROI, wherein the EVLD model utilizes a mechanical model to compute a mechanical power ($P_{M(t)}$) from the velocity and the acceleration of each EV and translating the mechanical power ($P_{M(t)}$) to an equivalent electrical power ($P_{E(t)}$) by an efficiency function η(v, a) as $P_{E(t)} = P_{M(t)}/\eta(v, a)$, wherein v denotes the velocity and a denotes the acceleration.

10. The non-transitory medium of claim 9, wherein the EV model comprises the mechanical model coupled to the electrical model providing load demand of each EV in terms of SOC of the battery of each EV.

11. The non-transitory medium of claim 9, wherein computing the SOC of the battery for each EV comprises:
estimating, by the mechanical model of the EV model, the mechanical power ($P_{M(t)}$) of each EV for each time window among the time windows based on the velocity and the acceleration of the corresponding EV for the corresponding time window;
estimating, by the electrical model of the EV model, the equivalent electrical power ($P_{E(t)}$) of the mechanical power ($P_{M(t)}$) for each EV for the corresponding time window, wherein the estimated electric power ($P_{E(t)}$) corresponds to a discharging power draining the battery if the computed mechanical power is greater than zero, and the computed electric power ($P_{E(t)}$) corresponds to a regenerative power charging the battery if the computed mechanical power ($P_{M(t)}$) is less than zero; and updating the SOC of the battery of the corresponding EV for the corresponding time window based on whether the computed equivalent electrical power ($P_{E(t)}$) is the regenerative power or the discharging power.

12. The non-transitory medium of claim 9, wherein aggregating the computed the load demand is based on a plurality of predefined charging policies comprising an End of Day, Home (EOD-H) charging policy and a Home and Away (HAA (q, ε)) charging policy, wherein the HAA (q, ε) charging policy further comprises a plurality of levels differentiated based on a plurality of levels of q providing unique EV penetration levels and a plurality of levels of ε providing unique SOC thresholds.

* * * * *